(12) United States Patent
Tanaka et al.

(10) Patent No.: US 10,748,693 B2
(45) Date of Patent: Aug. 18, 2020

(54) ELECTRONIC COMPONENT

(71) Applicant: ROHM CO., LTD., Kyoto (JP)

(72) Inventors: Bungo Tanaka, Kyoto (JP); Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 198 days.

(21) Appl. No.: 15/806,282

(22) Filed: Nov. 7, 2017

(65) Prior Publication Data
US 2018/0130587 A1    May 10, 2018

(30) Foreign Application Priority Data

Nov. 8, 2016    (JP) .................................. 2016-218181

(51) Int. Cl.
| | |
|---|---|
| *H01F 27/28* | (2006.01) |
| *H01F 17/00* | (2006.01) |
| *H01F 27/32* | (2006.01) |
| *H01F 5/00* | (2006.01) |
| *H01L 49/02* | (2006.01) |

(52) U.S. Cl.
CPC ......... *H01F 17/0013* (2013.01); *H01F 5/003* (2013.01); *H01F 27/2804* (2013.01); *H01F 27/324* (2013.01); *H01L 28/10* (2013.01); *H01F 27/2885* (2013.01); *H01F 2017/0073* (2013.01); *H01F 2017/0086* (2013.01); *H01F 2027/2809* (2013.01)

(58) Field of Classification Search
CPC ................. H01F 17/0013; H01F 5/003; H01F 2027/2809; H01F 2017/0073; H01F 2017/0086; H01L 28/10
USPC .................................. 336/200, 232; 257/531
See application file for complete search history.

(56) References Cited

U.S. PATENT DOCUMENTS

| | | | | |
|---|---|---|---|---|
| 2004/0094841 | A1* | 5/2004 | Matsuzaki | .............. H01L 21/56 257/758 |
| 2013/0135076 | A1 | 5/2013 | Nagase | |
| 2015/0137314 | A1* | 5/2015 | Osada | ................. H01L 23/5225 257/531 |
| 2016/0035672 | A1* | 2/2016 | Funaya | ............. H01L 21/02164 257/531 |
| 2019/0096558 | A1* | 3/2019 | Ito | ........................... H01F 27/29 |

FOREIGN PATENT DOCUMENTS

JP    2016-028407 A    2/2016

* cited by examiner

*Primary Examiner* — Tszfung J Chan
(74) *Attorney, Agent, or Firm* — Gregory M. Howison

(57) ABSTRACT

An electronic component includes a first insulating layer, a high-voltage electrode formed on the first insulating layer, a low-voltage electrode formed on the first insulating layer so as to be spaced from the high-voltage electrode, and an uneven structure formed in a region between the high-voltage electrode and the low-voltage electrode along a surface of the first insulating layer.

27 Claims, 31 Drawing Sheets

FIG. 3 (Final planar surface)

FIG. 4 (Upper coil planar surface)

FIG. 5 (Lower coil planar surface)

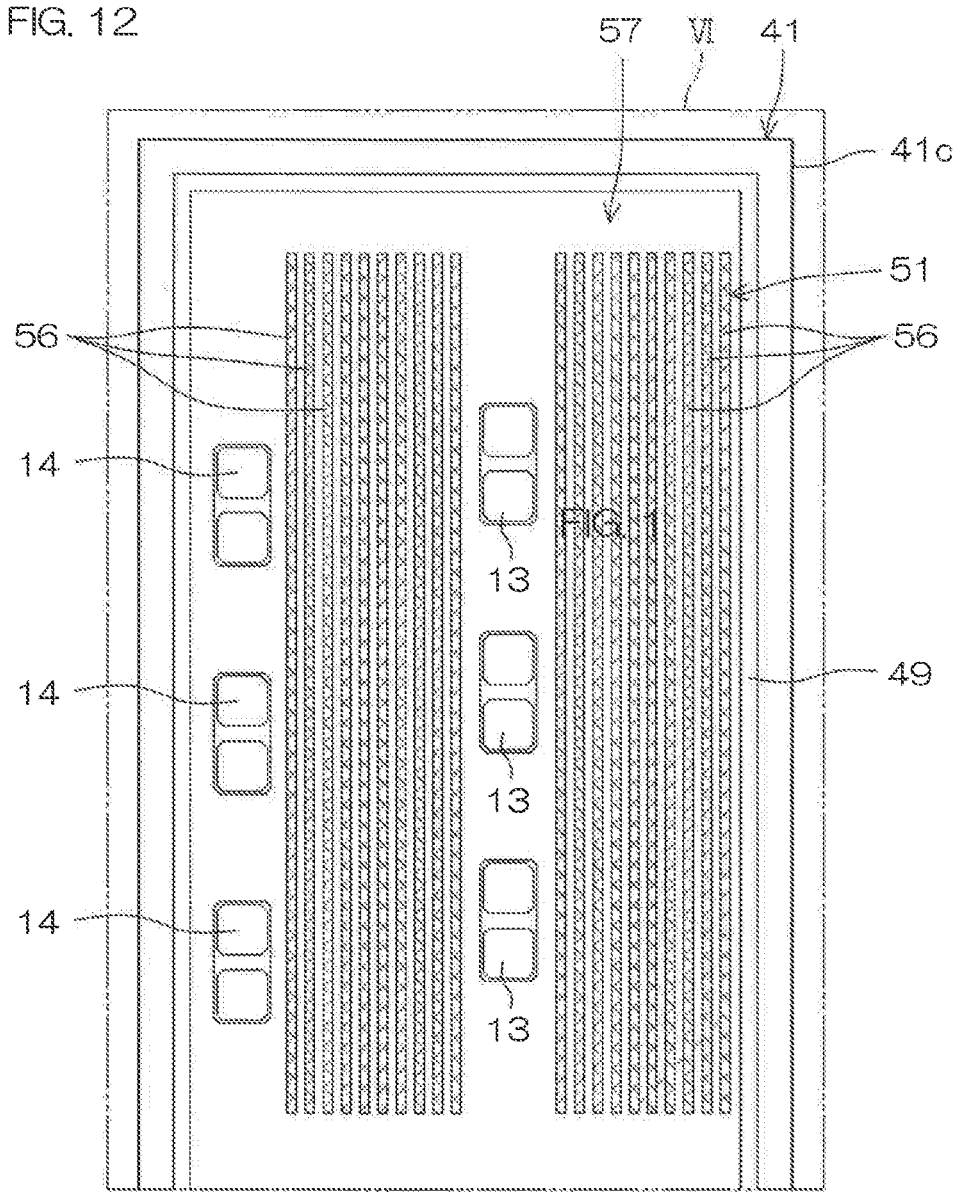

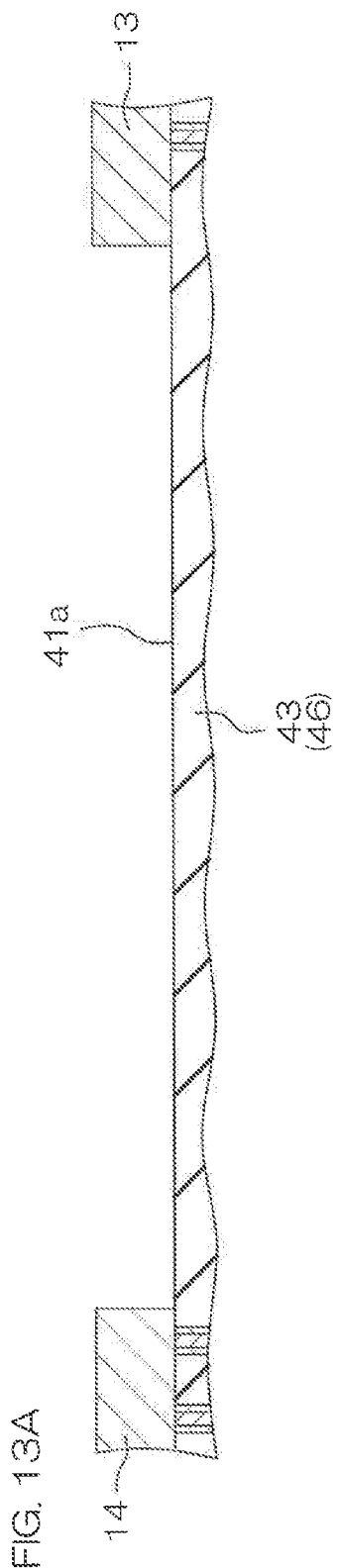

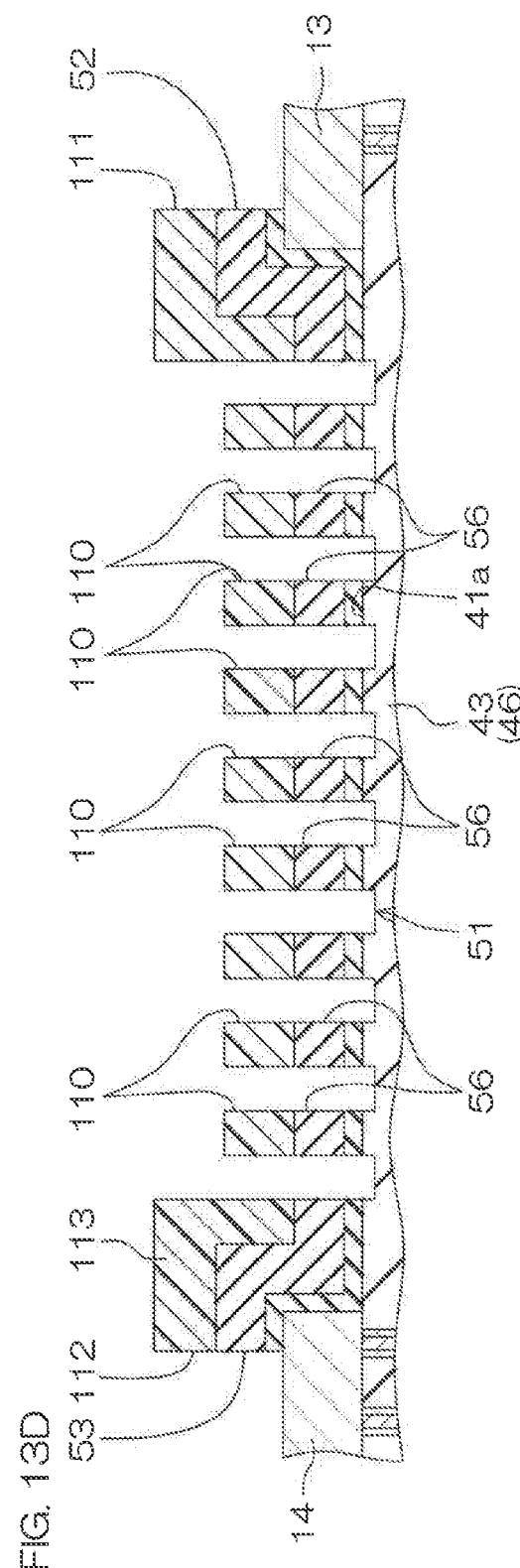

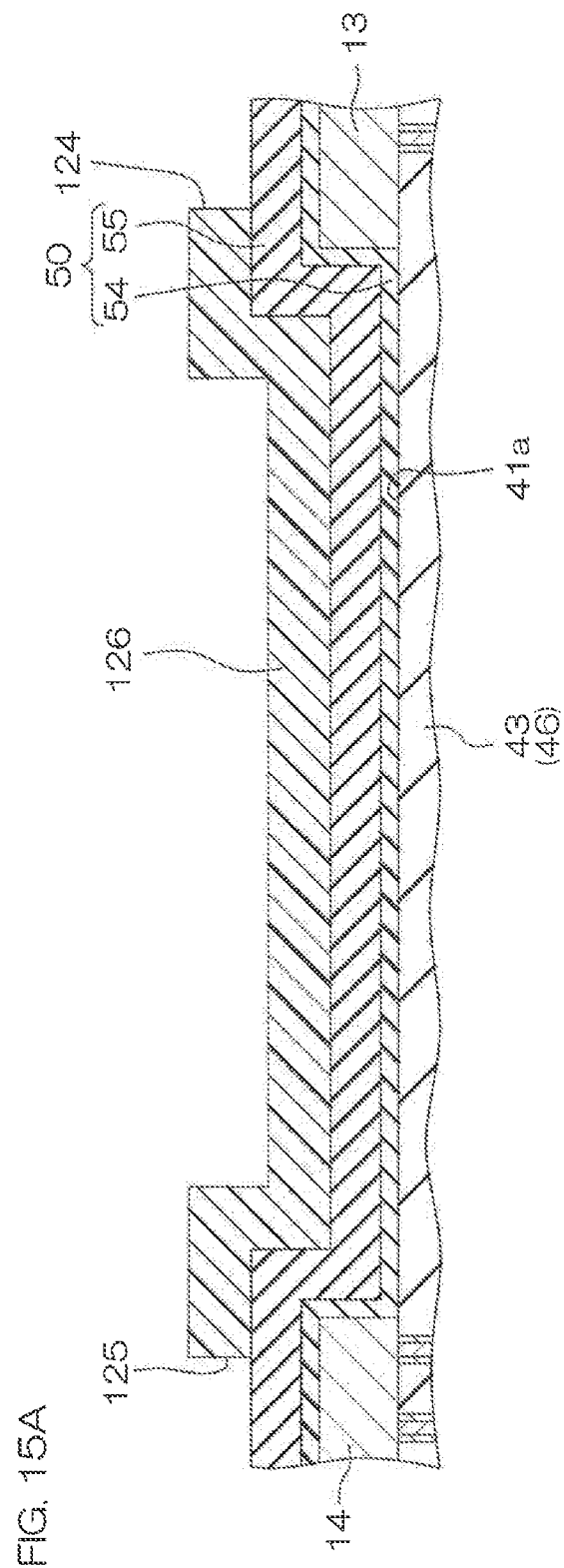

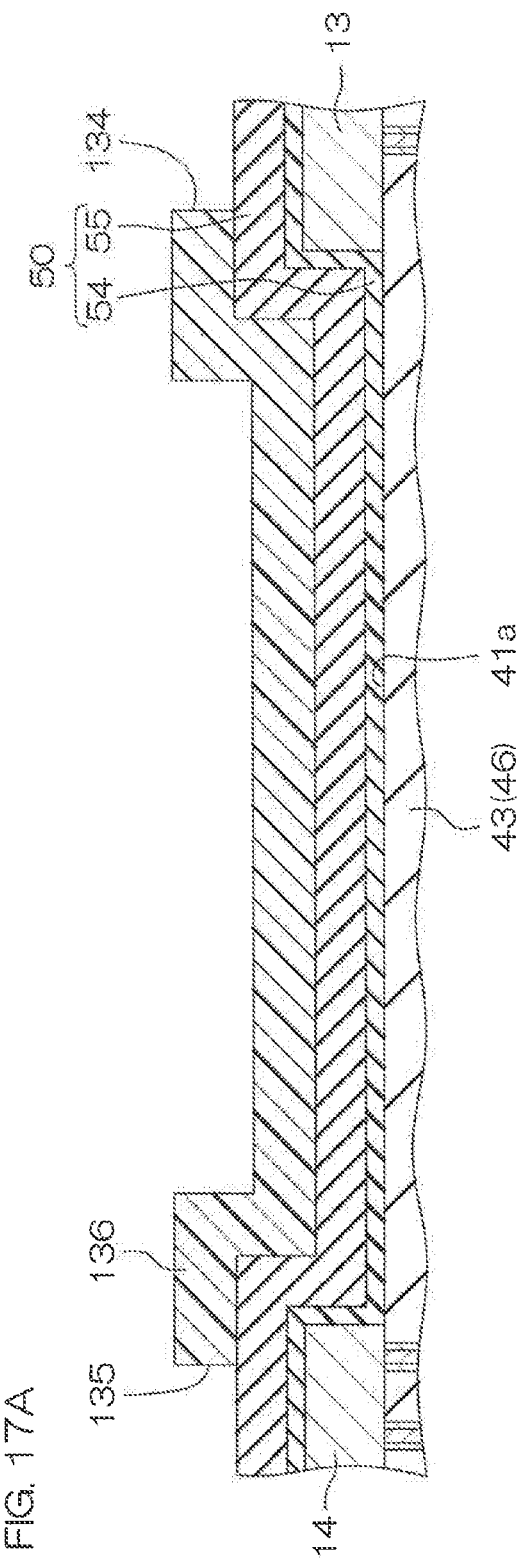

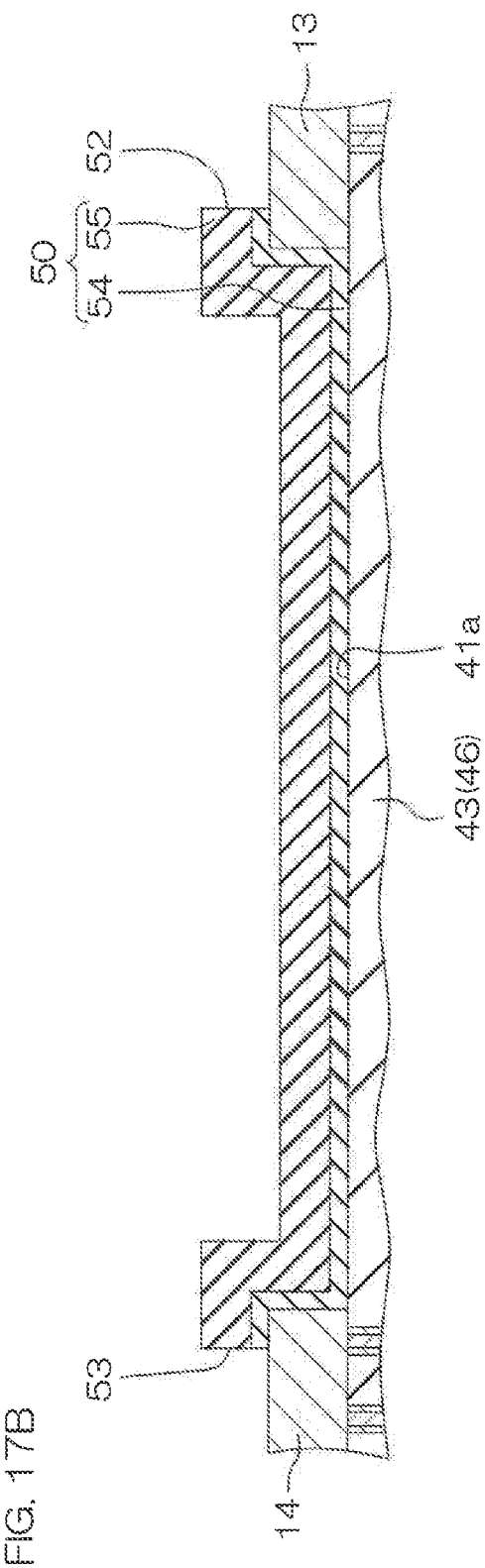

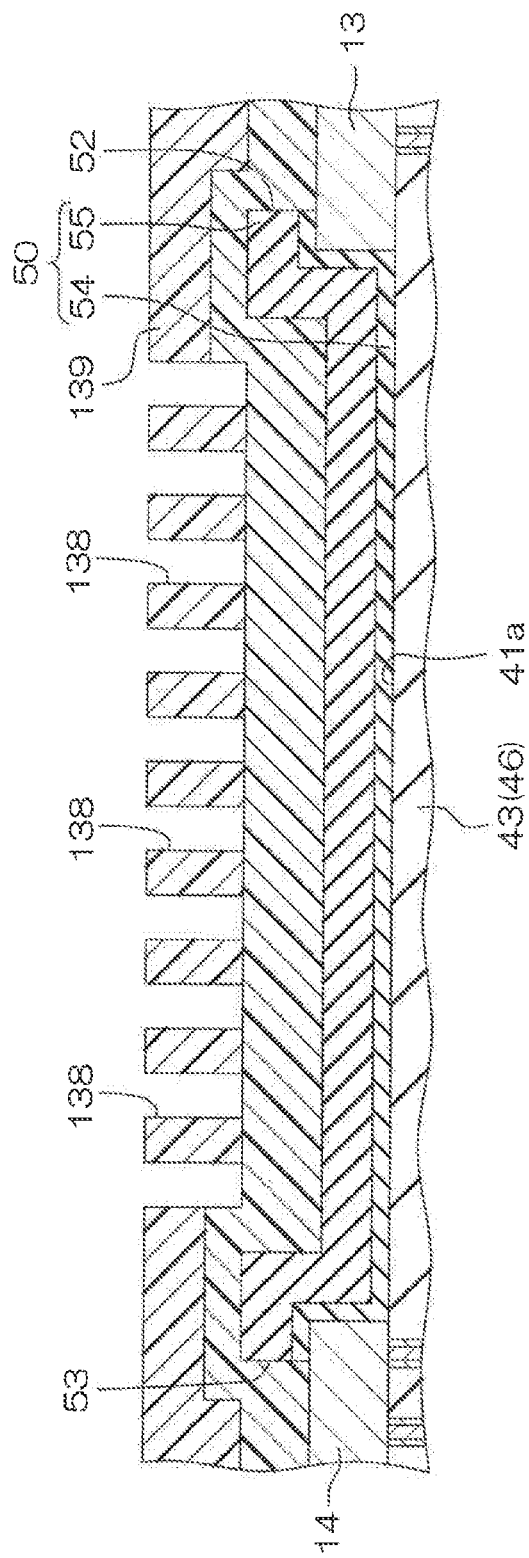

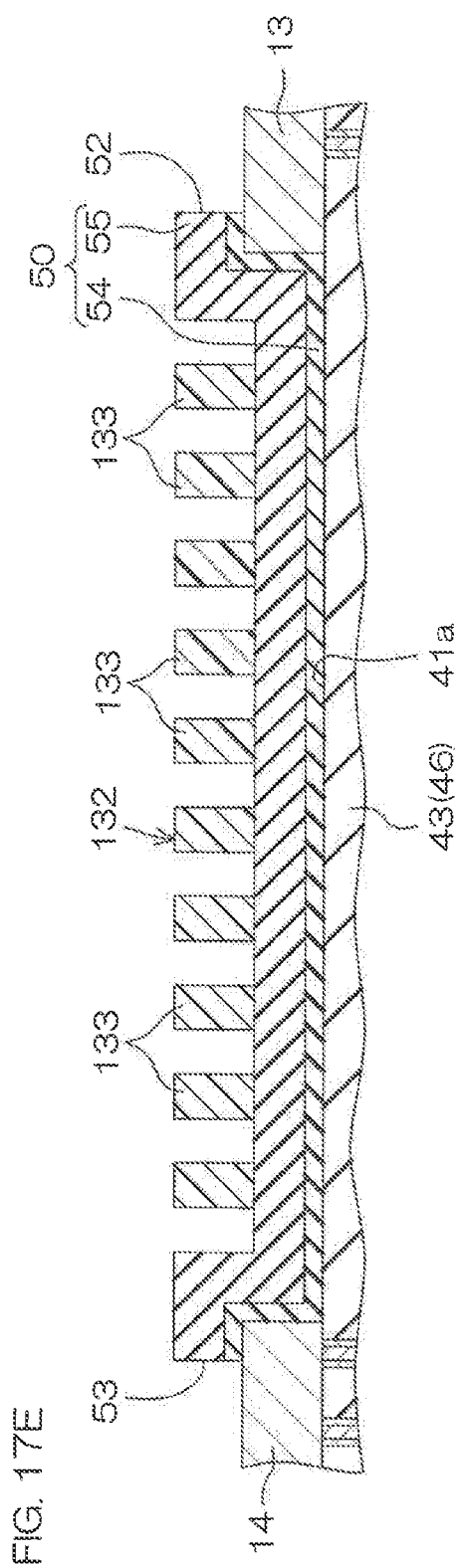

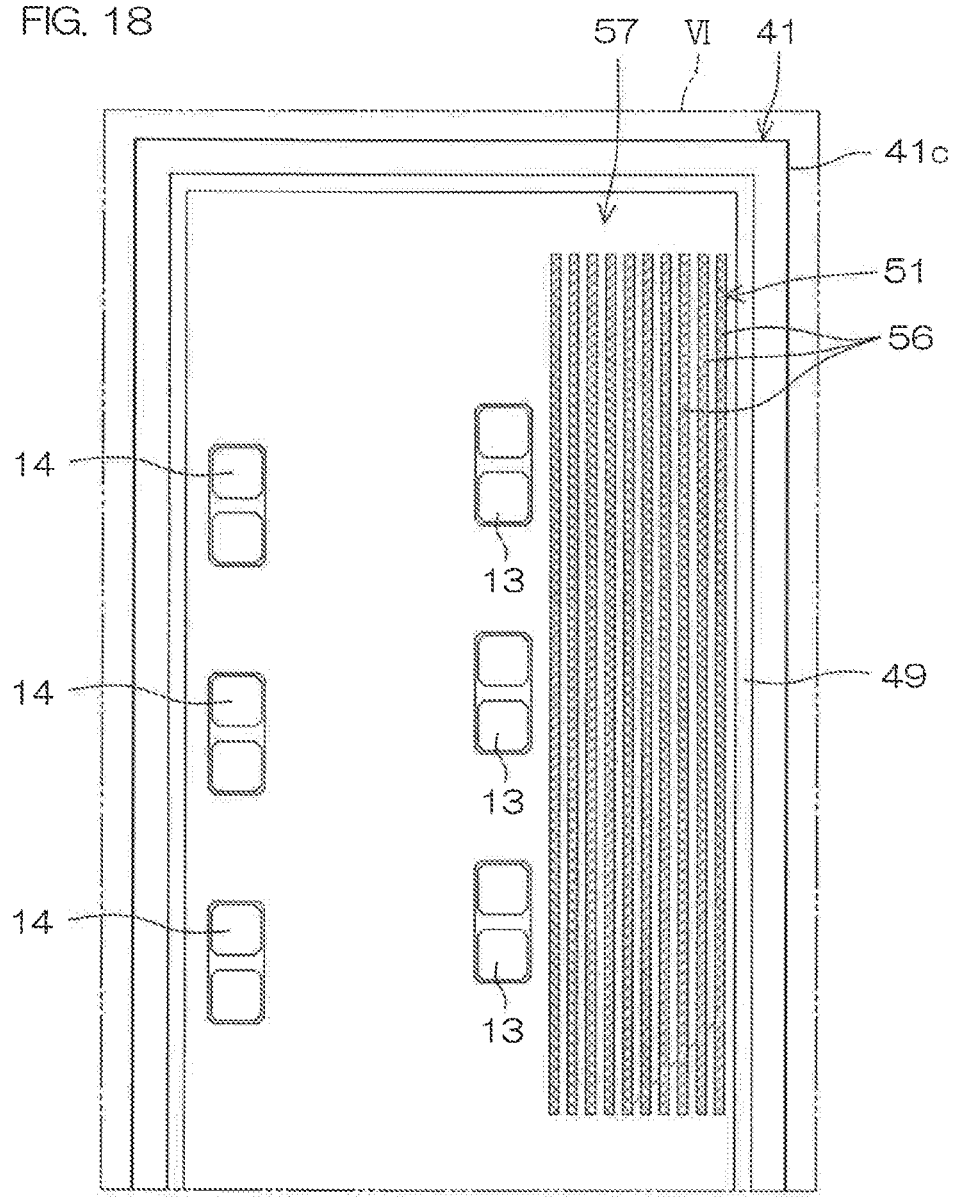

ELECTRONIC COMPONENT

BACKGROUND OF THE INVENTION

1. Field of the Invention

The present invention relates to an electronic component.

2. Description of the Related Art

US 2013/0135076 A1 discloses an electronic component including an insulating layer, a high-voltage lead (high-voltage electrode) formed on the insulating layer, and a low-voltage lead (low-voltage electrode) formed on the insulating layer so as to be spaced from the high-voltage lead.

SUMMARY OF THE INVENTION

A preferred embodiment of the present invention provides an electronic component including a first insulating layer, a high-voltage electrode formed on the first insulating layer, a low-voltage electrode formed on the first insulating layer so as to be spaced from the high-voltage electrode, and an uneven structure formed in a region between the high-voltage electrode and the low-voltage electrode along a surface of the first insulating layer.

A preferred embodiment of the present invention provides an electronic component including an insulating layer, a high-voltage electrode formed on the insulating layer, an embedded low-voltage electrode embedded in a region around the high-voltage electrode in the insulating layer, and an uneven structure formed in a region between the high-voltage electrode and the embedded low-voltage electrode along the surface of the insulating layer.

A preferred embodiment of the present invention provides an electronic component including a functional element main body that includes a functional element and has a first principal surface and a second principal surface, a high-voltage electrode formed on the first principal surface of the functional element main body, a low-voltage electrode formed on the first principal surface of the functional element main body so as to be spaced from the high-voltage electrode, and an uneven structure formed in a region between the high-voltage electrode and the low-voltage electrode along the first principal surface of the functional element main body.

The above-described or other objects, features, and effects of the present invention will be clarified by the following description of preferred embodiments with reference to the accompanying drawings.

BRIEF DESCRIPTION OF THE DRAWINGS

FIG. 12 is an enlarged view of the region corresponding to FIG. 4, showing a fourth modification of the uneven structure.

FIG. 13A is a view to describe an example of a method of manufacturing a concavo-convex structure of the transformer chip shown in FIG. 1.

FIG. 13D is a view showing a process after the process of FIG. 13C.

FIG. 15A is a view to describe an example of a method of manufacturing the uneven structure of the transformer chip shown in FIG. 14.

FIG. 17A is a view to describe an example of a method of manufacturing the uneven structure of the transformer chip shown in FIG. 16.

FIG. 17B is a view showing a process after the process of FIG. 17A.

FIG. 17D is a view showing a process after the process of FIG. 17C.

FIG. 17E is a view showing a process after the process of FIG. 17D.

FIG. 18 is an enlarged view of a region corresponding to FIG. 4, showing a modification of the uneven structure.

DETAILED DESCRIPTION OF THE PREFERRED EMBODIMENTS

Figure 1:
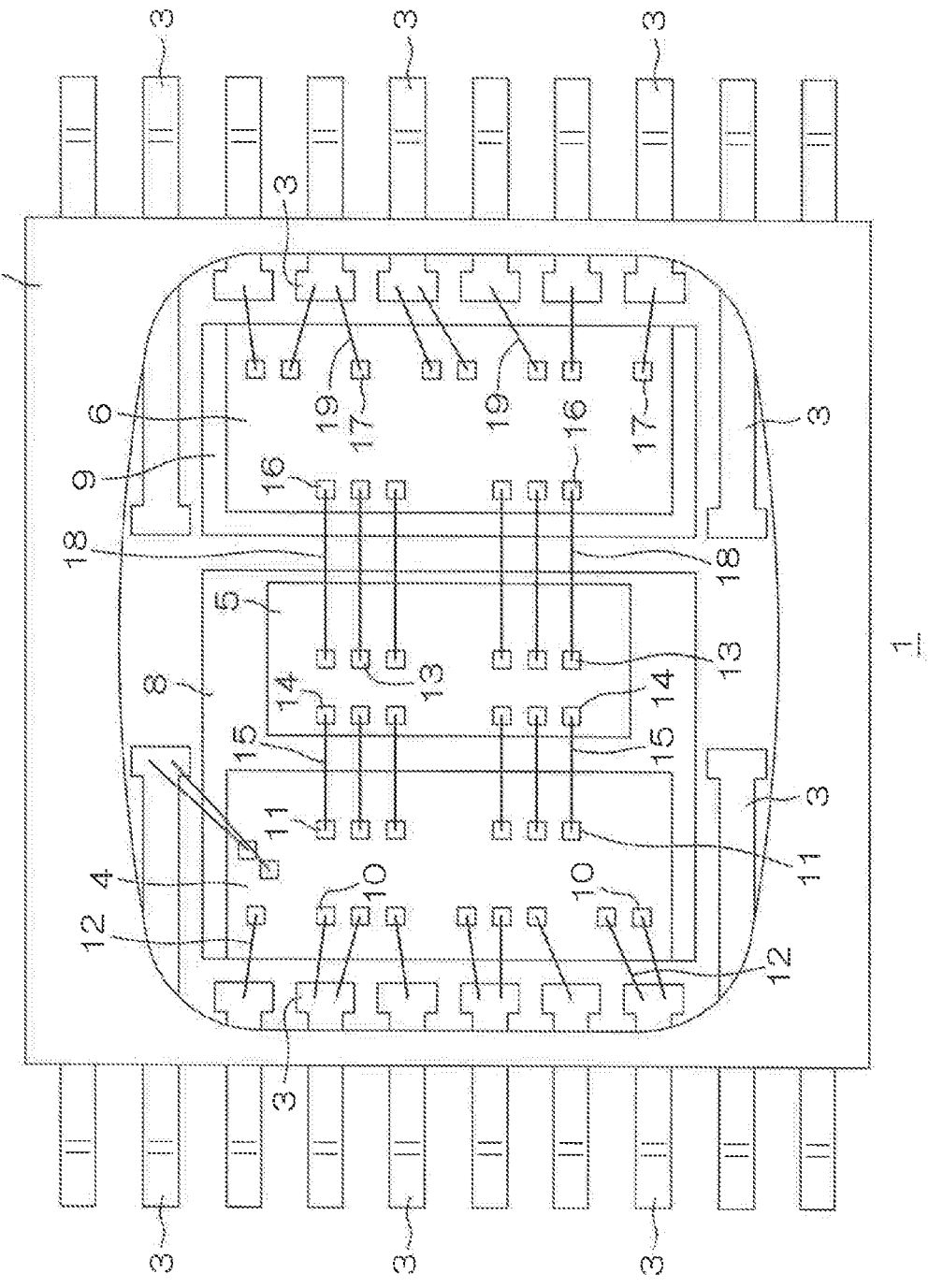
FIG. 1 is a plan view of a module in which a transformer chip according to a first preferred embodiment of the present invention is incorporated.

In an electronic component structured so that an insulating layer is present in a region between a high-voltage electrode and a low-voltage electrode, in the region between the high-voltage electrode and the low-voltage electrode, creeping discharge along the surface of the insulating layer may occur. If creeping discharge occurs, the insulating layer deteriorates or is broken, and as a result, the high-voltage electrode and the low-voltage electrode are short-circuited, and the withstand voltage of the electronic component may decrease.

Therefore, the present invention provides an electronic component which can be improved in withstand voltage by suppressing a short circuit between the high-voltage electrode and the low-voltage electrode caused by creeping discharge.

A preferred embodiment of the present invention provides an electronic component including a first insulating layer, a high-voltage electrode formed on the first insulating layer, a low-voltage electrode formed on the first insulating layer so as to be spaced from the high-voltage electrode, and an uneven structure formed in a region between the high-voltage electrode and the low-voltage electrode along a surface of the first insulating layer.

According to this electronic component, a creeping distance (that is, an insulating distance) between the high-voltage electrode and the low-voltage electrode can be increased by the uneven structure. Thereby, occurrence of creeping discharge in the region between the high-voltage electrode and the low-voltage electrode can be suppressed, so that the short circuit between the high-voltage electrode and the low-voltage electrode can be suppressed caused by creeping discharge. As a result, an electronic component capable of being improved in withstand voltage can be provided.

A preferred embodiment of the present invention provides an electronic component including an insulating layer, a high-voltage electrode formed on the insulating layer, an embedded low-voltage electrode embedded in a region around the high-voltage electrode in the insulating layer, and an uneven structure formed in a region between the high-voltage electrode and the embedded low-voltage electrode along the surface of the insulating layer.

According to this electronic component, a creeping distance (that is, an insulating distance) between the high-voltage electrode and the embedded low-voltage electrode can be increased by the uneven structure. Thereby, occurrence of creeping discharge in the region between the high-voltage electrode and the embedded low-voltage electrode can be suppressed, so that the short circuit between the high-voltage electrode and the low-voltage electrode can be suppressed caused by creeping discharge. As a result, an electronic component capable of being improved in withstand voltage can be provided.

A preferred embodiment of the present invention provides an electronic component including a functional element main body that includes a functional element and has a first principal surface and a second principal surface, a high-voltage electrode formed on the first principal surface of the functional element main body, a low-voltage electrode formed on the first principal surface of the functional element main body so as to be spaced from the high-voltage electrode, and an uneven structure formed in a region between the high-voltage electrode and the low-voltage electrode along the first principal surface of the functional element main body.

According to this electronic component, a creeping distance (that is, an insulating distance) between the high-voltage electrode and the low-voltage electrode can be increased by the uneven structure. Thereby, occurrence of creeping discharge in the region between the high-voltage electrode and the low-voltage electrode can be suppressed, so that the short circuit between the high-voltage electrode and the low-voltage electrode can be suppressed caused by creeping discharge. As a result, an electronic component capable of being improved in withstand voltage can be provided.

Hereinafter, preferred embodiments of the present invention are described in detail with reference to the accompanying drawings.

FIG. 1 is a plan view of a module 1 in which a transformer chip 5 (electronic component) according to a first embodiment of the present invention is incorporated.

The module 1 is a semiconductor module obtained by one-packaging a plurality of chips. The module 1 includes a resin package 2, a plurality of leads 3, a controller chip 4, a transformer chip 5, and a driver chip 6.

The resin package 2 is formed into a quadrangular (square) plate shape by using a sealing resin 7. The sealing resin 7 may include epoxy resin. The plurality of leads 3 are, in the present preferred embodiment, provided across the inside and the outside of the resin package 2 at a pair of faced end faces of the resin package 2.

A package type of the module 1 is SOP (Small Outline Package). Instead of SOP, various package types such as QFP (Quad Flat Package) and SOJ (Small Outline J-lead Package) may be adopted for the module 1.

The transformer chip 5 is arranged at the substantially central portion of the resin package 2. The controller chip 4 is a controller IC, and is arranged on one lead 3 side with respect to the transformer chip 5. The driver chip 6 is a driver IC, and is arranged on the other lead 3 side with respect to the transformer chip 5.

The controller chip 4, the transformer chip 5, and the driver chip 6 are formed into quadrangular (rectangular) plate shapes. The transformer chip 5 is, in the present preferred embodiment, smaller than the controller chip 4 and the driver chip 6.

The controller chip 4 and the transformer chip 5 are arranged on a first die pad 8. The driver chip 6 is arranged on a second die pad 9 spaced from the first die pad 8.

On the surface of the controller chip 4, a plurality of first pads 10 and a plurality of second pads 11 are formed so as to be spaced from each other. The plurality of first pads 10 are aligned along a longer side close to the leads 3. The plurality of second pads 11 are aligned along a longer side close to the transformer chip 5.

The plurality of first pads 10 are connected to corresponding leads 3 by bonding wires 12. The disposition of the plurality of first pads 10 and the disposition of the second pads 11 are just examples and can be changed as appropriate, and are not limited to the dispositions shown in FIG. 1.

On the surface of the transformer chip 5, a plurality of high-voltage pads 13 (high-voltage electrodes) and a plurality of low-voltage pads 14 (low-voltage electrodes) are formed so as to be spaced from each other. The plurality of high-voltage pads 13 are arranged on the driver chip 6 side with respect to the plurality of low-voltage pads 14. The plurality of low-voltage pads 14 are aligned along a longer side on the controller chip 4 side.

The plurality of high-voltage pads 13 are aligned on a longer side on the driver chip 6 side. The plurality of low-voltage pads 14 are connected to corresponding second pads 11 of the controller chip 4 by bonding wires 15. The disposition of the high-voltage pads 13 and the disposition of the low-voltage pads 14 are just examples and can be changed as appropriate, and are not limited to the dispositions shown in FIG. 1.

On the surface of the driver chip 6, a plurality of first pads 16 and a plurality of second pads 17 are formed so as to be spaced from each other. The plurality of first pads 16 are aligned along a longer side on the transformer chip 5 side. The plurality of second pads 17 are aligned along a longer side close to the leads 3.

The plurality of first pads 16 are connected to the corresponding high-voltage pads 13 of the transformer chip 5 by bonding wires 18. The plurality of second pads 17 are connected to the leads 3 by bonding wires 19. The disposition of the plurality of first pads 16 and the disposition of the plurality of second pads 17 are just examples and can be changed as appropriate, and are not limited to the dispositions shown in FIG. 1.

Figure 2:
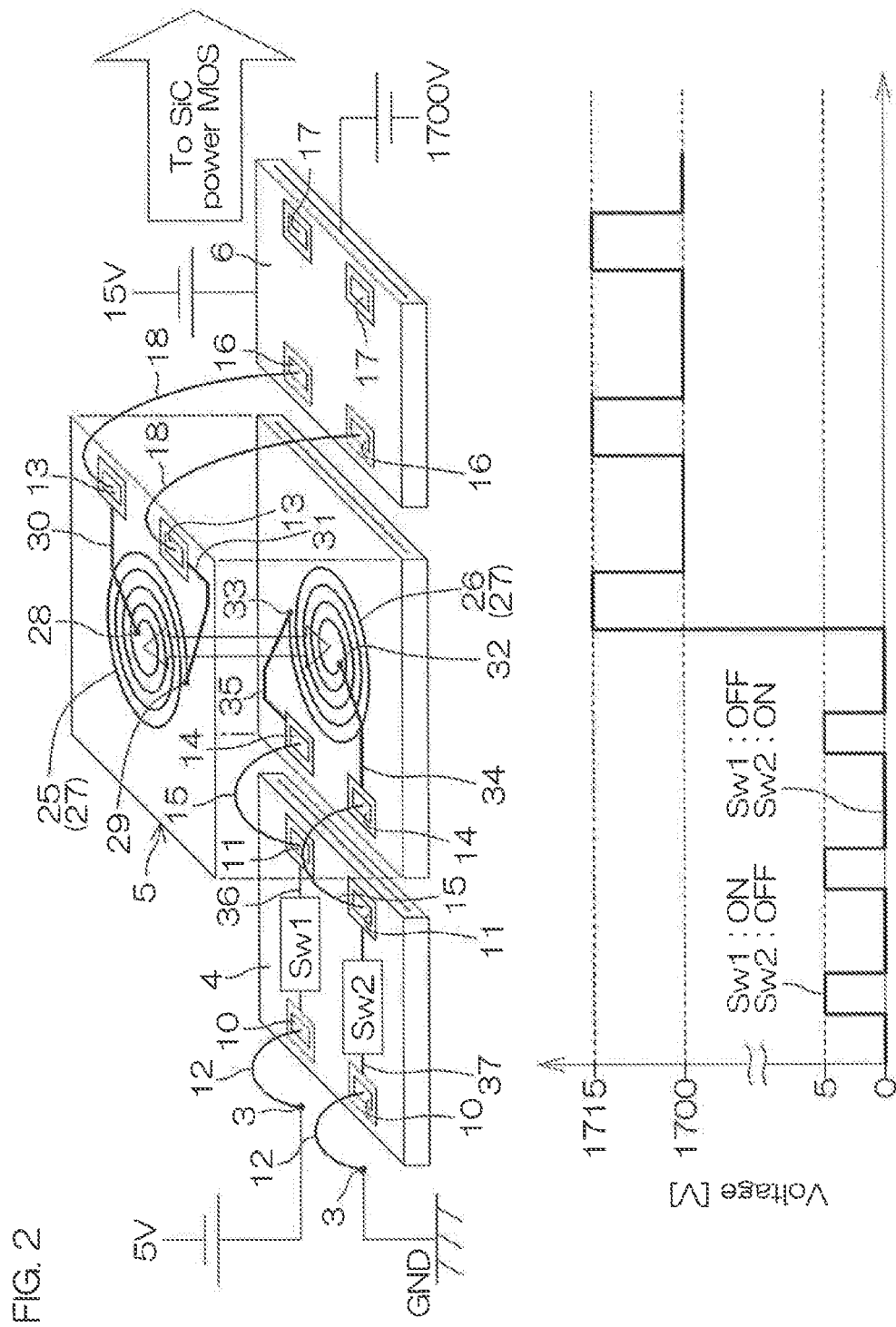
FIG. 2 is an illustrated diagram showing an electric structure of the module shown in FIG. 1.

FIG. 2 is an illustrated diagram of an electric structure of the module 1 shown in FIG. 1.

Referring to FIG. 2, the transformer chip 5 includes a high-voltage-side spiral upper coil 25 (high-voltage coil) and a low-voltage-side spiral lower coil 26 (low-voltage coil). The upper coil 25 and the lower coil 26 face each other at an interval in the vertical direction.

One transformer 27 is configured by magnetic coupling of the upper coil 25 and the lower coil 26. The controller chip 4 and the driver chip 6 are DC-insulated by the transformer 27 (the upper coil 25 and the lower coil 26), and AC-connected by the transformer 27 (the upper coil 25 and the lower coil 26).

The upper coil 25 includes an inner coil end 28 (inner terminal end of the spiral) and an outer coil end 29 (outer terminal end of the spiral). To the inner coil end 28 of the upper coil 25, a high-voltage wiring 30 is connected. To the outer coil end 29 of the upper coil 25, a high-voltage wiring 31 is connected. The terminal end of the high-voltage wiring 30 and the terminal end of the high-voltage wiring 31 are exposed as high-voltage pads 13.

The lower coil 26 includes an inner coil end 32 (inner terminal end of the spiral) and an outer coil end 33 (outer terminal end of the spiral). To the inner coil end 32 of the lower coil 26, a low-voltage wiring 34 is connected. To the outer coil end 33 of the lower coil 26, a low-voltage wiring 35 is connected. The terminal end of the low-voltage wiring 34 and the terminal end of the low-voltage wiring 35 are exposed as low-voltage pads 14.

In the controller chip 4, in the middle of a wiring 36 connecting a certain first pad 10 and a certain second pad 11, a switching element Sw1 that switches the wiring 36 between conduction and cutoff is provided. The switching element Sw1 may be a transistor.

In the controller chip 4, in the middle of a wiring 37 connecting another first pad 10 and another second pad 11, a switching element Sw2 that switches the wiring 37 between conduction and cutoff is provided. The switching element Sw2 may be a transistor.

The first pad 10 on the wiring 36 side is connected to an input voltage via a bonding wire 12. A voltage value of the input voltage is, herein, 15V. The second pad 11 on the wiring 36 side is connected to the low voltage pad 14 of the transformer chip 5 via a bonding wire 15.

The first pad 10 on the wiring 37 side is connected to the ground via a bonding wire 12. The second pad 11 on the wiring 37 side is connected to the low-voltage pad 14 of the transformer chip 5 via a bonding wire 15. Therefore, to the transformer chip 5, a voltage of 15V is applied based on the ground potential as a reference potential.

To the driver chip 6, in the present preferred embodiment, a control voltage of 15V is applied based on 1700V as a reference potential. To the plurality of second pads 17 of the driver chip 6, for example, an SiC-MOSFET is connected. The SiC-MOSFET is controlled based on the reference potential of 1700 V.

The controller chip 4 generates a periodic pre-boosted pulse voltage by alternately repeating a first application state (Sw1: ON, Sw2: OFF) and a second application state (Sw1: OFF, Sw2: ON).

The pre-boosted pulse voltage generated by the controller chip 4 is given to the lower coil 26 via the bonding wires 15. In the example shown in FIG. 2, a pre-boosted pulse voltage of 5V is given to the lower coil 26.

When the pre-boosted pulse voltage is given to the lower coil 26, the voltage value of the pre-boosted pulse voltage is boosted as much as a transformer ratio (winding ratio) of the lower coil 26 and the upper coil 25 by electromagnetic induction. Accordingly, a boosted pulse voltage is output from the upper coil 25 to the driver chip 6 via the bonding wires 18. In the example shown in FIG. 2, a boosted pulse voltage of 15V is output from the upper coil 25 to the driver chip 6.

The driver chip 6 generates a control pulse voltage obtained by adding the boosted pulse voltage (=15V) to the reference potential of 1700V, and gives it to the SiC-MOSFET. The SiC-MOSFET is controlled by 15V as a potential difference between the control pulse voltage (=1715V) and the reference potential (=1700V).

The detailed voltage values shown in FIG. 2 are just examples used to describe operation of the module 1. The reference voltage of the driver chip 6 may be at a value not more than 1700V (for example, 1200V), or a value over 1700V (for example, 3750V).

Figure 3:
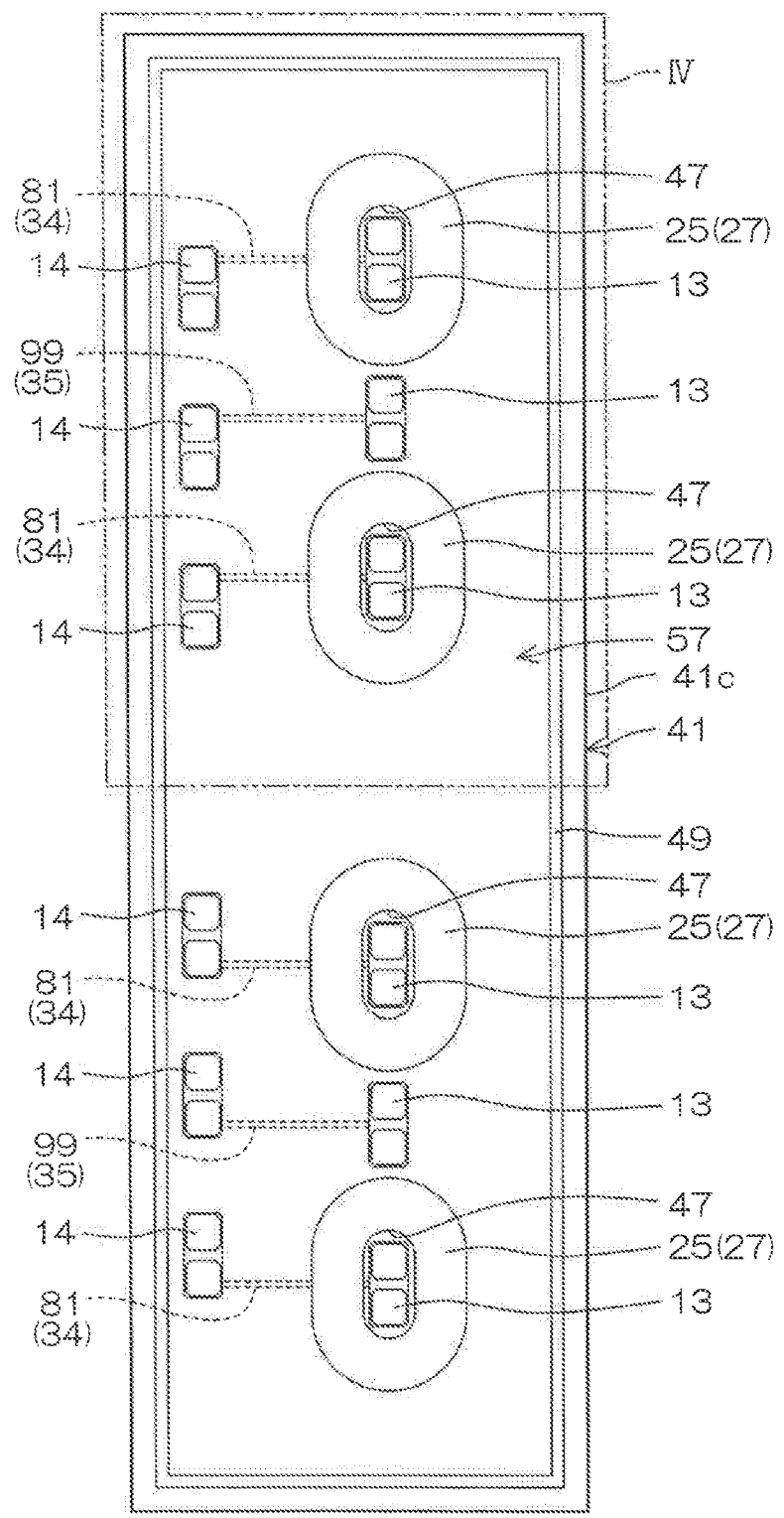
FIG. 3 is a view to describe a planar structure of the transformer chip shown in FIG. 1.
Figure 4:
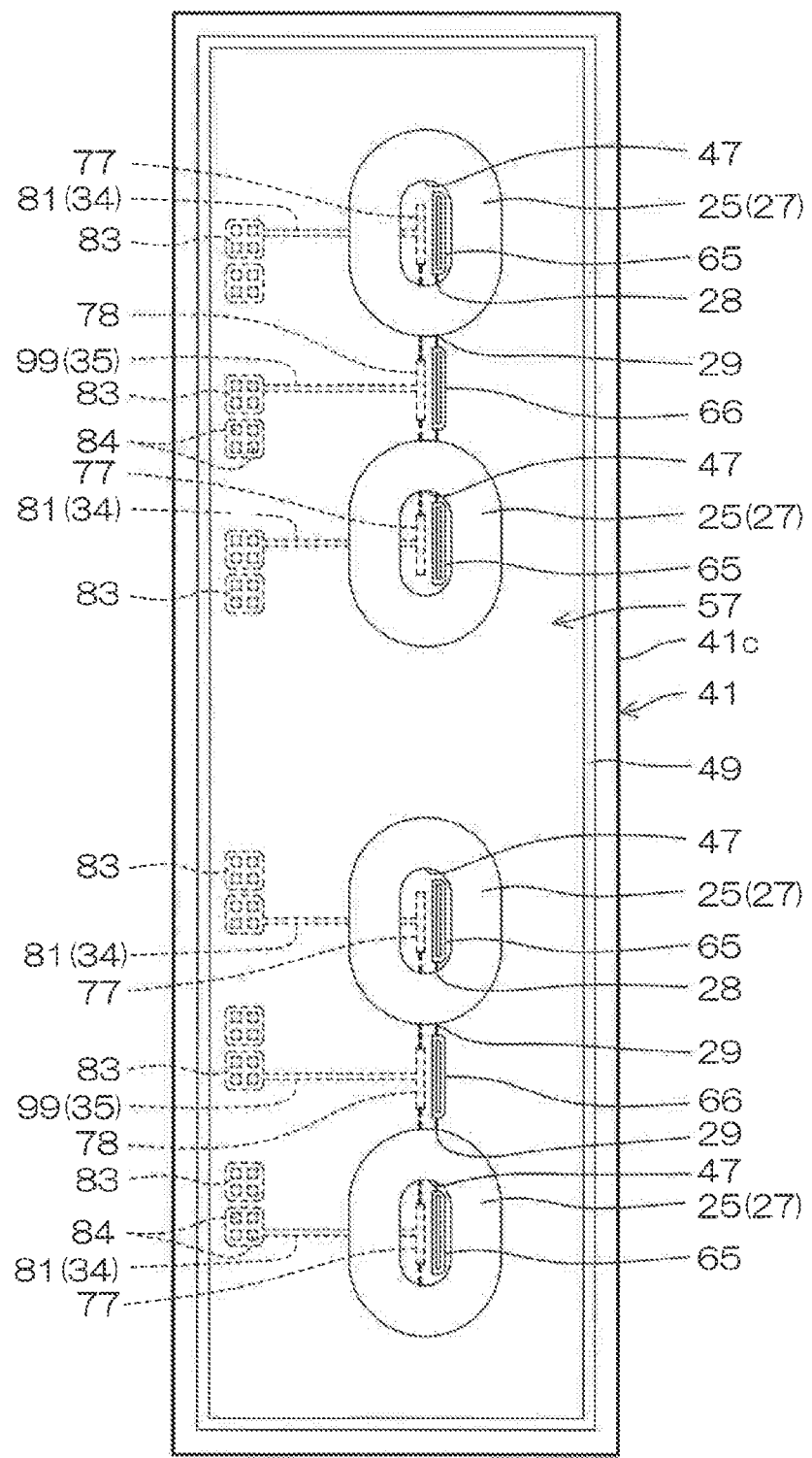
FIG. 4 is a view to describe a planar structure of upper coils of the transformer chip shown in FIG. 1.
Figure 5:
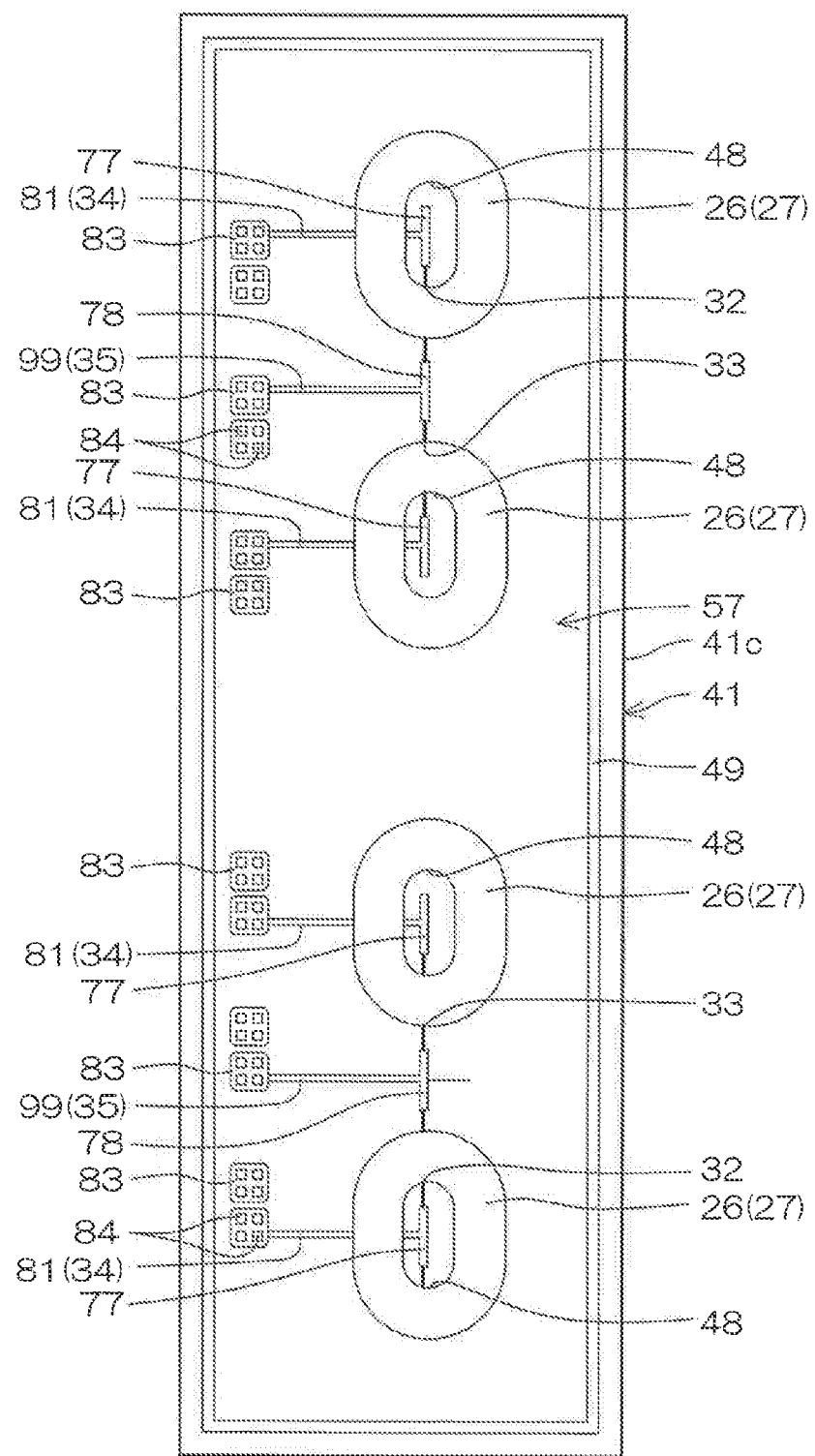
FIG. 5 is a view to describe a planar structure of lower coils of the transformer chip shown in FIG. 1.
Figure 6:
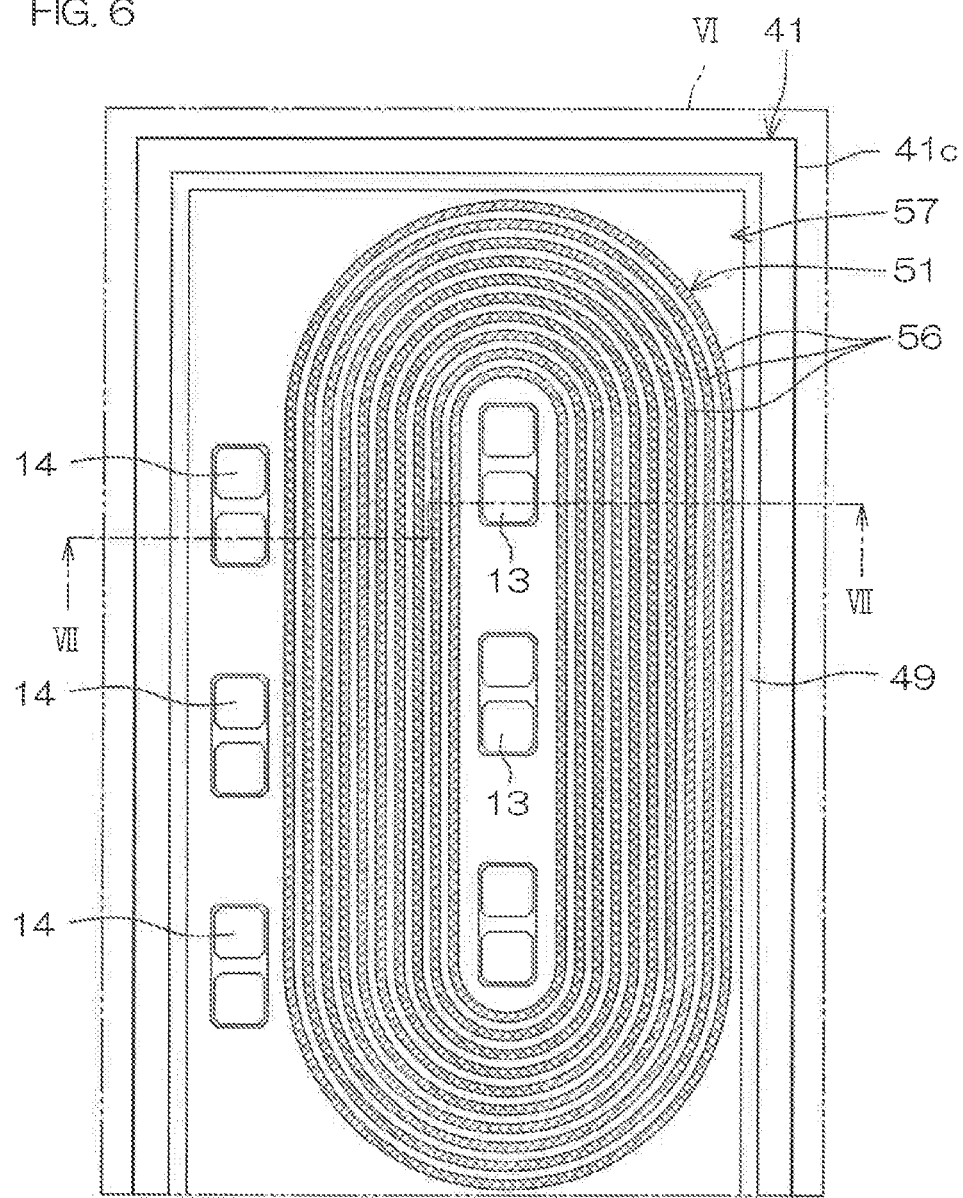
FIG. 6 is an enlarged view of a region VI shown in FIG. 4.
Figure 7:
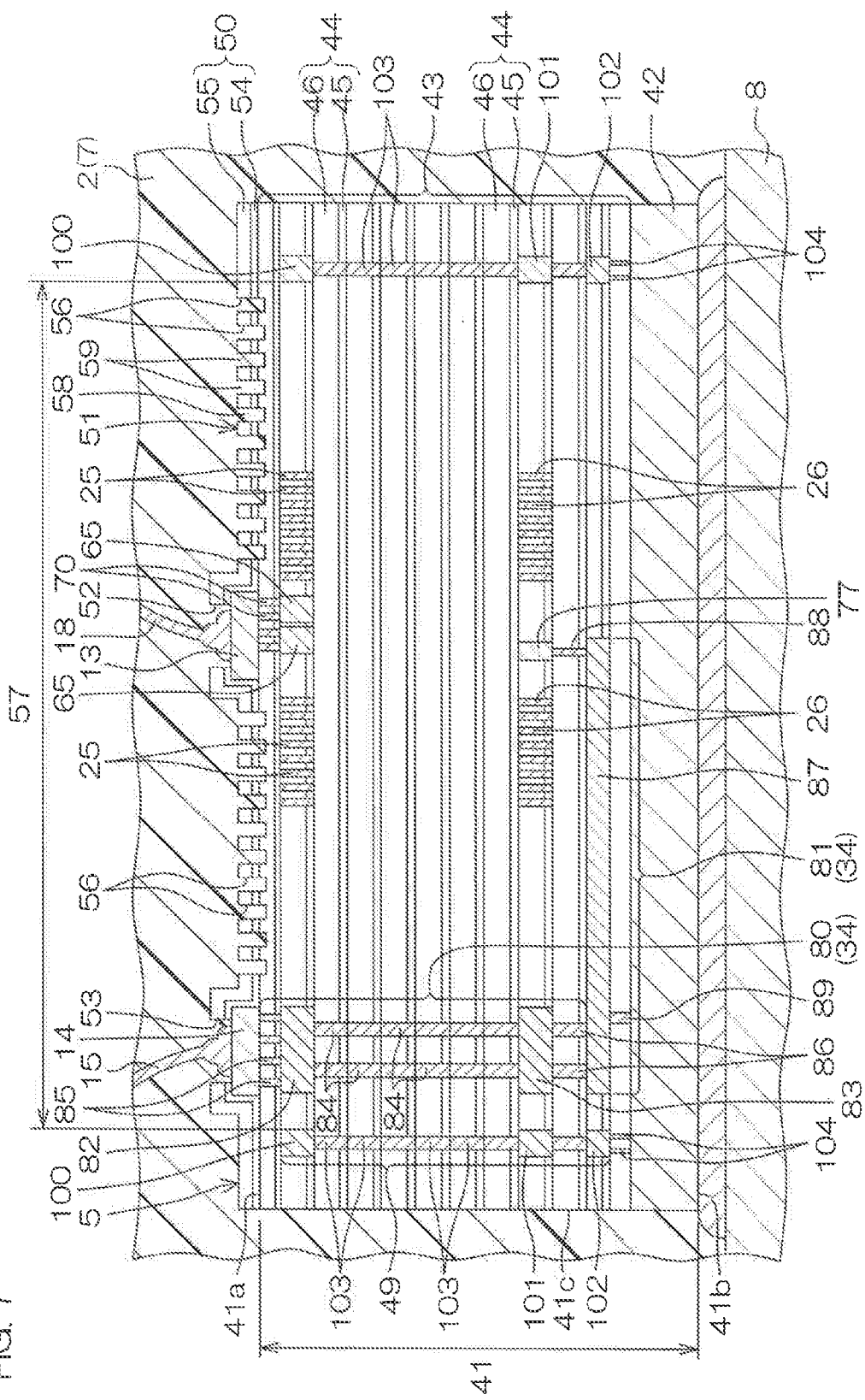
FIG. 7 is a sectional view taken along line VII-VII in FIG. 6.
Figure 8:
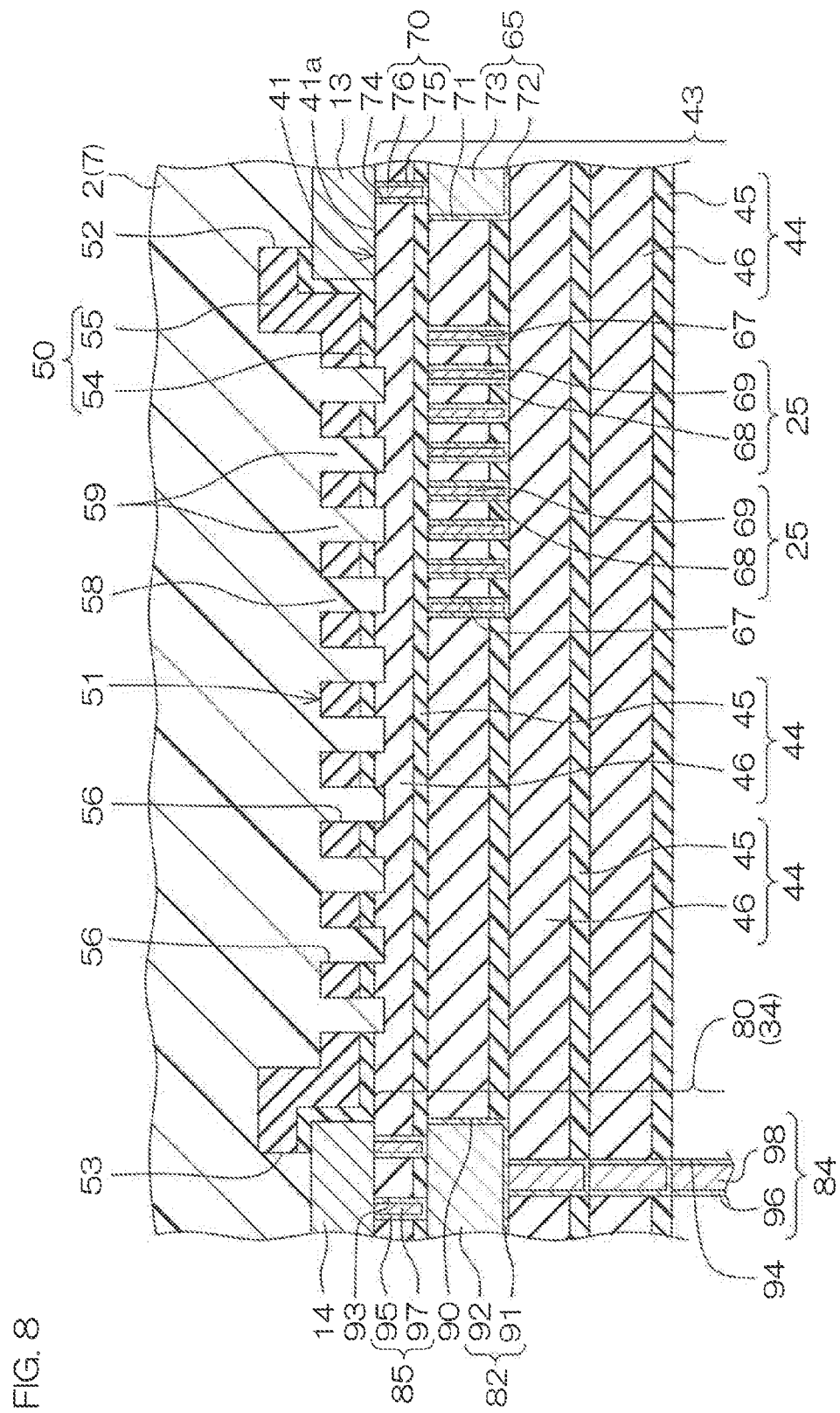
FIG. 8 is an essential portion enlarged view of the transformer chip shown in FIG. 7.

FIG. 3 is a view to describe a planar structure of the transformer chip 5. FIG. 4 is a view to describe a planar structure of the upper coils 25 of the transformer chip 5. FIG. 5 is a view to describe a planar structure of the lower coils 26 of the transformer chip 5. FIG. 6 is an enlarged view of the region VI in FIG. 4. FIG. 7 is a sectional view taken along line VII-VII in FIG. 6. FIG. 8 is an essential portion enlarged view of the transformer chip 5.

In FIG. 3 to FIG. 6, for convenience of description, illustrations of the bonding wires 15 and 18 connected to the transformer chip 5 and the sealing resin 7, etc., are not shown. In FIG. 6, for clarification, an uneven structure 51 (a plurality of recess portions 56) described below are hatched. In FIG. 7, for clarification, only metal portions are hatched.

Referring to FIG. 3 to FIG. 7, the transformer chip 5 includes a functional element main body 41 having a rectangular parallelepiped shape. The functional element main body 1 includes functional elements. The functional element is, in the present preferred embodiment, a transformer 27 including the upper coil 25 and the lower coil 26.

The functional element main body 41 has a first principal surface 41a on one side, a second principal surface 41b on the other side, and a side surface 41c connecting the first principal surface 41a and the second principal surface 41b. The first principal surface 41a and the second principal surface 41b of the functional element main body 41 are formed into rectangular shapes in a plan view viewed from their normal direction (hereinafter, simply referred to as "planar view,").

The functional element main body 41 includes a substrate 42, and an insulating layer laminated structure 43 (first insulating layer/element-side insulating layer) formed (supported) on a principal surface of the substrate 42. The second principal surface 41b of the functional element main body 41 is formed of the substrate 42. The first principal surface 41a of the functional element main body 41 is formed of the insulating layer laminated structure 43.

The substrate 42 may be a semiconductor substrate such as an Si (silicon) substrate or an SiC (silicon carbide) substrate. When the substrate 42 is formed of a semiconductor substrate, the transformer chip 5 can be regarded as a kind of semiconductor devices.

The insulating layer laminated structure 43 includes a plurality of (in the present preferred Embodiments, 12) insulating layers laminated in order from the substrate 42 side. Each of the plurality of insulating layers 44 except for the lowermost insulating layer 44 in contact with the principal surface of the substrate 42 has a laminated structure including an etching stopper film 45 as a lower layer and an interlayer dielectric film 46 as an upper layer. The interlayer dielectric film 46 includes an insulating material different from that of the etching stopper film 45.

The uppermost layer of the insulating layer laminated structure 43 is formed of, in the present preferred embodiment, the interlayer dielectric film 46. Therefore, the uppermost interlayer dielectric film 46 forms the first principal surface 41a of the functional element main body 41. The lowermost insulating layer 44 consists of only the interlayer dielectric film 46.

The etching stopper film 45 may include at least one kind of an SiN film, an SiC film, or an SiCN film. The interlayer dielectric film 46 may include at least one kind of an $SiO_2$ film, an SiN film, an SiC film, or an SiCN film. The etching stopper film 45 is, in the present preferred embodiment, an SiN film. The interlayer dielectric film 46 is, in the present preferred embodiment, an $SiO_2$ film.

Inside the insulating layer laminated structure 43, the transformer 27 as the functional element is formed. The transformer 27 includes the upper coil 25 and the lower coil 26. The upper coil 25 and the lower coil 26 are formed in insulating layers 44 different from each other in insulating layer laminated structure 43. The upper coil 25 and the lower coil 26 face each other across one or more insulating layers 44.

The upper coil 25 is formed in, in the present preferred embodiment, the 11th insulating layer 44 from the substrate 42. The lower coil 26 is formed in, in the present preferred embodiment, the 4th insulating layer 44 from the substrate 42 so that six insulating layers 44 are sandwiched between the lower coil and the upper coil 25.

Referring to FIG. 4, the upper coil 25 is formed in an oval annular region surrounding the circumference of an inside region 47 so that the inside region 47 having an oval shape in a plan view is defined at the center of the upper coil. A total of four upper coils 25 in two pairs are formed at intervals in a longitudinal direction of the transformer chip 5.

Referring to FIG. 5, the lower coil 26 is formed in an oval annular region surrounding the circumference of an inside region 48 so that the inside region 48 having an oval shape in a plan view is defined at the center of the lower coil. A total of four lower coils 26 in two pairs are formed at intervals in a longitudinal direction of the transformer chip 5. Each of the four lower coils 26 and each of the four upper coils 25 face each other in a stacking direction of the insulating layer laminated structure 43.

Referring to FIG. 3 to FIG. 8, the transformer chip 5 includes a plurality of high-voltage pads 13 and a plurality of low-voltage pads 14. The plurality of high-voltage pads 13 and the plurality of low-voltage pads 14 are formed on the first principal surface 41a of the functional element main body 41 (the surface of the insulating layer laminated structure 43) so as to be spaced from each other. The plurality of high-voltage pads 13 and the plurality of low-voltage pads 14 are formed as uppermost wirings of the insulating layer laminated structure 43.

As the plurality of high-voltage pads 13, a total of six high-voltage pads are arranged one each above the inside regions 47 of the upper coils 25 and above regions between the upper coils 25 of each pair. The plurality of high-voltage pads 13 are aligned along the longitudinal direction of the functional element main body 41.

As the plurality of low-voltage pads 14, a total of six low-voltage pads are arranged one each on the lateral sides of the respective high-voltage pads 13. The plurality of low-voltage pads 14 are aligned along the longitudinal direction of the functional element main body 41.

The high-voltage pads 13 and the low-voltage pads 14 may include at least one kind of aluminum (Al), copper (Cu), or an aluminum-copper alloy (AlCu).

The transformer chip 5 includes a shield electrode layer 49 (embedded low-voltage electrode). The shield electrode layer 49 is an electrode layer to which a voltage lower than a voltage to be applied to the high-voltage pads 13 is applied. The shield electrode layer 49 is embedded in a region around the high-voltage pads 13 in the insulating layer laminated structure 43.

The shield electrode layer 49 is formed into a wall shape along the side surface 41c of the functional element main body 41 so as to surround an inside region 57 including the upper coils 25, the lower coils 26, the plurality of high-voltage pads 13, and the plurality of low-voltage pads 14, etc. The shield electrode layer 49 is formed into a rectangular annular shape in a plan view.

The shield electrode layer 49 is connected at its bottom portion to the substrate 42. Thereby, the shield electrode layer 49 is fixed to a substrate voltage. The substrate voltage may be a ground potential. The shield electrode layer 49 may be at the same potential as that of the low-voltage pads 14.

The shield electrode layer 49 prevents moisture from entering the inside region 57 from the outside (outside of the side surface 41c of the functional element main body 41). The shield electrode layer 49 prevents cracks from occurring in the side surface 41c of the functional element main body 41 from spreading to the inside region 57.

The transformer chip 5 includes a surface insulating layer 50 (second insulating layer/insulating layer). The surface insulating layer 50 covers the first principal surface 41a of the functional element main body 41 so that the high-voltage pads 13 and the low-voltage pads 14 are exposed.

The surface insulating layer 50 is formed on substantially the entire first principal surface 41a of the functional element main body 41. The surface insulating layer 50 includes pad openings 52 to expose the high-voltage pads 13 and pad openings 53 to expose the low-voltage pads 14. The pad openings 52 expose the inside regions of the high-voltage pads 13 except for edge portions. The pad openings 52 expose the inside regions of the low-voltage pads 14 except for edge portions.

The surface insulating layer 50 has, in the present preferred embodiment, a laminated structure including a protective film 54 and a passivation film 55 laminated in this order from the insulating layer laminated structure 43 side. The passivation film 55 may include an insulating material different from an insulating material forming the protective film 54. The protective film 54 may include $SiO_2$. The passivation film 55 may include SiN.

The passivation film 55 has a thickness larger than that of the protective film 54. The thickness of the protective film 54 may be 100 nm or more and 3000 nm or less. The thickness of the passivation film 55 may be 100 nm or more and 3000 or less.

Referring to FIG. 6 to FIG. 8, the transformer chip 5 includes an uneven structure 51. The uneven structure 51 is formed in a region between the high-voltage pads 13 and the low-voltage pads 14 along the first principal surface 41a of the functional element main body 41 (the surface of the insulating layer laminated structure 43).

The uneven structure 51 increases a creeping distance between the high-voltage pad 13 and the low-voltage pad 14. The creeping distance is an insulating distance between the high-voltage pad 13 and the low-voltage pad 14. The uneven structure 51 suppresses occurrence of creeping discharge between the high-voltage pads 13 and the low-voltage pads 14.

In the present preferred embodiment, the uneven structure 51 is also provided in a region between the high-voltage pads 13 and the shield electrode layer 49. Therefore, the uneven structure 51 suppresses occurrence of creeping discharge between the high-voltage pads 13 and the shield electrode layer 49 as well.

The uneven structure 51 includes, in the present preferred embodiment, a plurality of recess portions 56 recessed from the surface of the surface insulating layer 50 toward the insulating layer laminated structure 43. The plurality of recess portions 56 are formed at intervals in a direction away from the plurality of high-voltage pads 13.

The plurality of recess portions 56 collectively surround the plurality of high-voltage pads 13. In the present preferred embodiment, the plurality of recess portions 56 collectively surround three high-voltage pads 13 arranged above the inside regions of the respective upper coils 25 and above the region between each pair of the upper coils 25, on one side in the longitudinal direction of the functional element main body 41.

Therefore, the plurality of recess portions 56 include a recess portion 56 that has a relatively short perimeter and a recess portion 56 that has a relatively long perimeter surrounding the recess portion 56 with the relatively short perimeter. The plurality of recess portions 56 are formed into endless oval annular shapes in a plan view. The planar shapes of the plurality of recess portions 56 are not limited to oval annular shapes, but may be polygonal annular shapes (for example, quadrangular annular shapes or rectangular annular shapes).

Referring to FIG. 7 and FIG. 8, in the present preferred embodiment, the plurality of recess portions 56 penetrate through the surface insulating layer 50 to expose the insulating layer laminated structure 43. In detail, the plurality of recess portions 56 penetrate through the passivation film 55 and the protective film 54 to expose the uppermost interlayer dielectric film 46 in the insulating layer laminated structure 43. The bottom portions of the plurality of recess portions 56 are positioned inside the uppermost interlayer dielectric film 46.

In the region between the high-voltage pads 13 and the low-voltage pads 14, the plurality of recess portions 56 are formed at intervals along a facing direction of the high-voltage pads 13 and the low-voltage pads 14, and extend along a direction intersecting this opposing direction.

In the region between the high-voltage pads 13 and the shield electrode layer 49, the plurality of recess portions 56 are formed at intervals along a facing direction of the high-voltage pads 13 and the shield electrode layer 19, and extend along a direction intersecting this opposing direction.

In the present preferred embodiment, on the other side in the longitudinal direction of the functional element main body 41, an uneven structure 51 (a plurality of recess portions 56) is also formed to collectively surround three high-voltage pads 13. The structure of the uneven structure 51 formed on the other side in the longitudinal direction of the functional element main body 41 is the same as the structure of the uneven structure 51 formed on one side in the longitudinal direction of the functional element main body 41, so that description thereof is omitted.

The uneven structure 51 (the plurality of recess portions 56) may be formed in a region between a plurality of high-voltage pads 13 adjacent to each other. The uneven structure 51 (the plurality of recess portions 56) may collectively surround all high-voltage pads 13 formed on the functional element main body 41.

The uneven structure 51 (the plurality of recess portions 56) may be formed so as to individually surround the plurality of high-voltage pads 13. In this case, the uneven structure 51 (the plurality of recess portions 56) may be formed into oval annular shapes, circular annular shapes, polygonal annular shapes (for example, quadrangular annular shapes), etc., in a plan view.

Referring to FIG. 7 and FIG. 8, the transformer chip 5 further includes a resin layer 58. The resin layer 58 is formed of, in the present preferred embodiment, a part of the sealing resin 7 forming the resin package 2. The resin layer 58 infills the uneven structure 51 and covers the surface insulating layer 50 between the high-voltage pads 13 and the low-voltage pads 14.

The resin layer 58 has an uneven anchor structure 59 that engages with the uneven structure 51 at a portion in contact with the uneven structure 51 (the plurality of recess portions 56). The resin layer 58 closely adheres to inner surfaces including side walls and bottom walls of the plurality of recess portions 56 inside the plurality of recess portions 56. That is, inside the plurality of recess portions 56, the resin layer 58 is in contact with the insulating layer laminated structure 43 (the uppermost interlayer dielectric film 46), the protective film 54, and the passivation film 55.

Accordingly, adhesion of the resin layer 58 to the surface insulation layer 50 can be improved. Therefore, the resin layer 58 can be prevented from separating from the surface insulating layer 50. In addition, a void can be prevented from being formed in a boundary region between the resin layer 58 and the surface insulating layer 50 (that is, a portion of contact between the resin layer 58 and the surface insulating layer 50).

Hereinafter, referring to FIG. 3 to FIG. 8 again, detailed structures of the upper coils 25, the lower coils 26, the plurality of high-voltage pads 13, and the plurality of low-voltage pads 14, etc., are described.

Referring to FIG. 4, in the inside region 47 of each upper coil 25, an inner coil end wiring 65 is formed. In each pair of upper coils, between upper coils 25 adjacent to each other, an outer coil end wiring 66 is formed.

In each pair, one upper coil 25 and the other upper coil 25 are electrically connected by the outer coil end wiring 66. Thereby, the one upper coil 25, the other upper coil 25, the inner coil end wiring 65 and the outer coil end wiring 66 are at the same potential.

Referring to FIG. 8, in an oval annular region surrounding the inside region 47 in the insulating layer 44, an oval spiral coil groove 67 is formed. The coil groove 67 is formed to penetrate through the interlayer dielectric film 46 and the etching stopper film 45 under the interlayer dielectric film. Thereby, an upper end and a lower end of the coil groove 67 become surfaces respectively opened to an etching stopper film 45 of an upper insulating layer 44 and an interlayer dielectric film 46 of a lower insulating layer 44.

On the inner surface (side surface and bottom surface) of the coil groove 67, a barrier electrode 68 is formed. The barrier electrode 68 is formed into a film following the inner surface of the coil groove 67 so that a space opened upward is formed inside the coil groove 67.

In the present preferred embodiment, the barrier electrode 68 has a laminated structure in which a tantalum (Ta) film, a tantalum nitride (TaN) film, and a tantalum (Ta) film are laminated in this order from the side close to the inner surface of the coil groove 67.

In the coil groove 67, inside the barrier electrode 68, a conductor 69 including copper (Cu) is embedded. Accordingly, the upper coil 25 including the barrier electrode 68 and the conductor 69 is formed.

The upper coil 25 is formed so that its upper surface is flush with the upper surface of the insulating layer 44. The side surface, upper surface, and lower surface of the upper coil 25 are in contact with insulating layers 44 different from each other. In detail, the side surface of the upper coil 25 is in contact with the etching stopper film 45 and the interlayer dielectric film 46 of the insulating layer 44 in which the upper coil 25 is embedded.

The upper surface of the upper coil 25 is in contact with the etching stopper film 45 of the insulating layer 44 formed as an upper layer on the insulating layer 44 in which the upper coil 25 is embedded. The lower surface of the upper coil 25 is in contact with the interlayer dielectric film 46 of the insulating layer 44 formed as a lower layer under the insulating layer 44 in which the upper coil 25 is embedded.

The inner coil end wiring 65 embedded in the same insulating layer 44 as that of the upper coil 25 is connected to a certain high-voltage pad 13 via a via hole 70. Although not shown, the outer coil end wiring 66 embedded in the same insulating layer 44 as that of the upper coil 25 is connected to another high-voltage pad 13 via a via hole by the same structure.

Accordingly, via the inner coil end wiring 65 and the via hole 70, and the outer coil end wiring 66 and a via hole (not shown), a signal transmitted to the upper coil 25 can be output from the high-voltage pad 13.

A combination of the inner coil end wiring 65 and the via hole 70 connected thereto, and a combination of the outer coil end wiring 66 and a via hole (not shown) connected thereto, respectively constitute the high-voltage wiring 30 and the high-voltage wiring 31 shown in FIG. 2.

The inner coil end wiring 65 includes, as with the upper coil 25, a barrier electrode 72 and a conductor 73 embedded in a wiring groove 71. The via hole 70 connected to the inner coil end wiring 65 includes, as with the upper coil 25, a barrier electrode 75 and a conductor 76 embedded in a wiring groove 74.

For the barrier electrodes 72 and 75, the same material as that of the barrier electrode 68 described above can be used. For the conductors 73 and 76, the same material as that of the conductor 69 described above can be used. The outer coil end wiring 66 and a via hole (not shown) connected thereto can have the same configurations as those of the inner coil end wiring 65 and the via hole 70 connected thereto.

Referring to FIG. 4 and FIG. 5, in the inside region 48 of each lower coil 26, an inner coil end wiring 77 is formed. The inner coil end wiring 77 on the lower coil 26 side is arranged at a position deviating from the inner coil end wiring 65 on the upper coil 25 side in a plan view. In each pair, between lower coils 26 adjacent to each other, an outer coil end wiring 78 is formed.

The outer coil end wiring 78 on the lower coil 26 side is arranged at a position deviating from the outer coil end wiring 66 on the upper coil 25 side in a plan view. In each pair, one lower coil 26 and the other lower coil 26 are electrically connected by the outer coil end wiring 78. Accordingly, the one lower coil 26, the other lower coil 26, the inner coil end wiring 77, and the outer coil end wiring 78 are at the same potential.

Although detailed description is omitted, the lower coil 26 is structured in the same way as the upper coil 25 so as to include a barrier electrode and a conductor embedded in an oval spiral coil groove. The lower coil 26 is formed so that its upper surface is flush with the upper surface of the insulating layer 44. The side surface, upper surface, and lower surface of the lower coil 26 are in contact with insulating layers 44 different from each other.

In detail, the side surface of the lower coil 26 is in contact with the etching stopper film 45 and the interlayer dielectric film 46 of the insulating layer 44 in which the lower coil 26 is embedded. The upper surface of the lower coil 26 is in contact with the etching stopper film 45 of the insulating layer 44 formed as an upper layer on the insulating layer 44 in which the lower coil 26 is embedded. The lower surface of the lower coil 26 is in contact with the interlayer dielectric film 46 of the insulating layer 44 formed as a lower layer under the insulating layer 44 in which the lower coil 26 is embedded.

The lower coils 26 are connected to the respective low-voltage pads 14 by low-voltage wirings 34 and 35 laid inside the insulating layer laminated structure 43.

The low-voltage wiring 34 includes a penetrating wiring 80 and a lead-out wiring 81. The penetrating wiring 80 is formed into a columnar shape to penetrate from each low-voltage pad 14 through at least the insulating layer 44 in which the lower coil 26 is formed and reaches the insulating layer 44 lower than the lower coil 26. The lead-out wiring 81 is formed in the insulating layer 44 lower than the lower coil 26 so as to be led out from the low-voltage pad 14 side toward the lower coil 26 side.

In detail, the penetrating wiring 80 includes an upper low-voltage layer wiring 82, a lower low-voltage layer wiring 83, a plurality of via holes 84, a via hole 85, and a via hole 86.

The upper low-voltage layer wiring 82 is embedded in an island shape (quadrangular shape in a plan view) in the same insulating layer 44 as that of the upper coil 25. The lower low-voltage layer wiring 83 is embedded in an island shape (quadrangular shape in a plan view) in the same insulating layer 44 as that of the lower coil 26.

The plurality of via holes 84 connect the upper low-voltage layer wiring 82 and the lower low-voltage layer wiring 82. The via hole 85 connects the upper low-voltage layer wiring 82 and the low-voltage pad 14. The via hole 86 connects the lower low-voltage layer wiring 83 and the lead-out wiring 81.

A lead-out layer wiring 87 is embedded in the insulating layer 44 lower than the lower coil 26. The lead-out layer wiring 87 is formed into a belt shape intersecting the lower coil 26 on the lower side. The lead-out layer wiring 87 is connected to the substrate 42 via a via hole 89. Accordingly, the low-voltage wiring 34 is fixed to the substrate voltage. The via hole 88 connects the lead-out layer wiring 87 and the inner coil end wiring 77.

Each of the wirings 77, 82, 83, and 87 is formed by embedding a barrier electrode and a conductor in a wiring groove, as with the upper coil 25. Each of the via holes 84, 85, 86, 88, and 89 is formed by embedding a barrier electrode and a conductor in a wiring groove, as with the upper coil 25.

FIG. 8 shows an example in which the low-voltage layer wiring 82 is formed by embedding a barrier electrode 91 and a conductor 92 in a wiring groove 90. FIG. 8 also shows an example in which the via hole 84 is formed by embedding a barrier electrode 95 and a conductor 97 in a wiring groove 93. FIG. 8 also shows an example in which the via hole 85 is formed by embedding a barrier electrode 96 and a conductor 98 in a wiring groove 94.

Although detailed description is omitted, the low-voltage wiring 35 is also formed of wiring including a penetrating wiring (not shown) and a lead-out wiring 99 (refer to FIG. 3 to FIG. 5), as with the low-voltage wiring 34.

The inner coil end wiring 77 on the lower coil 26 side is connected to a certain low-voltage pad 14 via the penetrating wiring 80 and the lead-out wiring 81. The outer coil end wiring 78 on the lower coil 26 side is connected to another low-voltage pad 14 via a penetrating wiring (not shown) and the lead-out wiring 99. Thereby, a signal input into the low-voltage pad 14 can be transmitted to the lower coil 26 via the penetrating wiring 80 and the lead-out wiring 81.

Referring to FIG. 7, the shield electrode layer 49 includes a plurality of shield layer wirings 100, 101, and 102, a plurality of via holes 103, and a via hole 104.

The plurality of shield layer wirings 100, 101, and 102 are respectively embedded in the same insulating layers 44 as those of the upper coil 25, the lower coil 26, and the lead-out layer wiring 87. The plurality of via holes 103 respectively connect the plurality of shield layer wirings 100, 101, and 102. The via hole 104 connects the lowermost shield layer wiring 102 and the substrate 42.

Each of the plurality of shield layer wirings 100, 101, and 102 is formed by embedding a barrier electrode and a conductor in a wiring groove, as with the upper coil 25. Each of the via holes 103 and 104 is formed by embedding a barrier electrode and a conductor in a wiring groove, as with the upper coil 25.

As described above, according to the transformer chip 5, the uneven structure 51 is formed in the surface insulating layer 50 between the high-voltage pads 13 and the low-voltage pads 14. The uneven structure 51 includes a plurality of recess portions 56 formed in the surface insulating layer 50. Accordingly, the creeping distance (insulating distance) along the surface of the surface insulating layer 50 between the high-voltage pad 13 and the low-voltage pad 14 can be increased.

As a result, occurrence of creeping discharge can be prevented in the region between the high-voltage pad 13 and the low-voltage pad 14, so that a short circuit between the high-voltage pad 13 and the low-voltage pad 14 caused by creeping discharge can be suppressed. Therefore, breakage and deterioration of the surface insulating layer 50 caused by creeping discharge can be suppressed, so that a transformer chip 5 whose withstand voltage can be improved can be provided.

The transformer chip 5 includes the shield electrode layer 49 fixed to a comparatively low voltage. The shield electrode layer 49 is fixed to a substrate voltage (for example, ground potential). The plurality of concavo-convex structures 51 are also formed in a region between the high-voltage pads 13 and the shield electrode layer 49 in the surface insulating layer 50. Thereby, a creeping distance (insulating distance) along the surface of the surface insulating layer 50 between the high-voltage pad 13 and the shield electrode layer 49 can be increased.

As a result, occurrence of creeping discharge can be suppressed in the region between the high-voltage pad 13 and the shield electrode layer 49, so that a short circuit between the high-voltage pads 13 and the shield electrode layer 49 caused by creeping discharge can be suppressed. Therefore, breakage and deterioration of the surface insulating layer 50 caused by creeping discharge can be suppressed, so that the withstand voltage can be improved.

In particular, according to the transformer chip 5, the plurality of recess portions 56 are formed at intervals along a facing direction of the high-voltage pads 13 and the low-voltage pads 14, and extend along a direction intersecting the facing direction.

In addition, according to the transformer chip 5, the plurality of recess portions 56 are formed at intervals along a facing direction of the high-voltage pads 13 and the shield electrode layer 49, and extend along a direction intersecting the facing direction.

With these structures, the creeping distance between the high-voltage pad 13 and the low-voltage pad 14, and the creeping distance between the high-voltage pad 13 and the shield electrode layer 49, can be effectively increased.

The plurality of recess portions 56 penetrate through the surface insulating layer 50 to expose a part of the insulating layer laminated structure 43 (the uppermost interlayer dielectric film 46). Accordingly, the creeping distance between the high-voltage pad 13 and the shield electrode layer 49, and the creeping distance between the high-voltage pad 13 and the shield electrode layer 49, can be further increased.

According to the transformer chip 5, the resin layer 58 that infills the uneven structure 51 is formed. The resin layer 58 has an uneven anchor structure 59 that engages with the uneven structure 51 at a portion in contact with the uneven structure 51.

Accordingly, the resin layer 58 can be prevented from separating from the surface insulating layer 50, so that a void can be prevented from being formed in a boundary region between the resin layer 58 and the surface insulating layer 50 (that is, a portion where the resin layer 58 and the surface insulating layer 50 are in contact with each other).

Here, an example of a structure in which a void is formed in the boundary region is considered. In this structure, when a potential difference occurs between the high-voltage pad 13 and the low-voltage pad 14, an electric field becomes concentrated at the void.

In this case, there is a possibility that creeping discharge starting from an electric field generated in the void occurs, and discharge occurring in another region spreads to still another region through the void. Therefore, the risk of occurrence of creeping discharge in the surface insulating layer 50 increases.

On the other hand, when the resin layer 58 has the anchor structure 59 that engages with the uneven structure 51, adhesion of the resin layer 58 to the surface insulating layer 50 can be improved. Therefore, it becomes difficult for the resin layer 58 to separate from the surface insulating layer 50, so that a void can be prevented from being formed in the boundary region between the resin layer 58 and the surface insulating layer 50.

Thereby, the risk of creeping discharge to be caused by a void can be reduced. Therefore, the effect of protecting the functional element main body 41 by the resin layer 58 can be improved, and breakage and deterioration of the surface insulating layer 50 caused creeping discharge can be suppressed.

Figure 9:
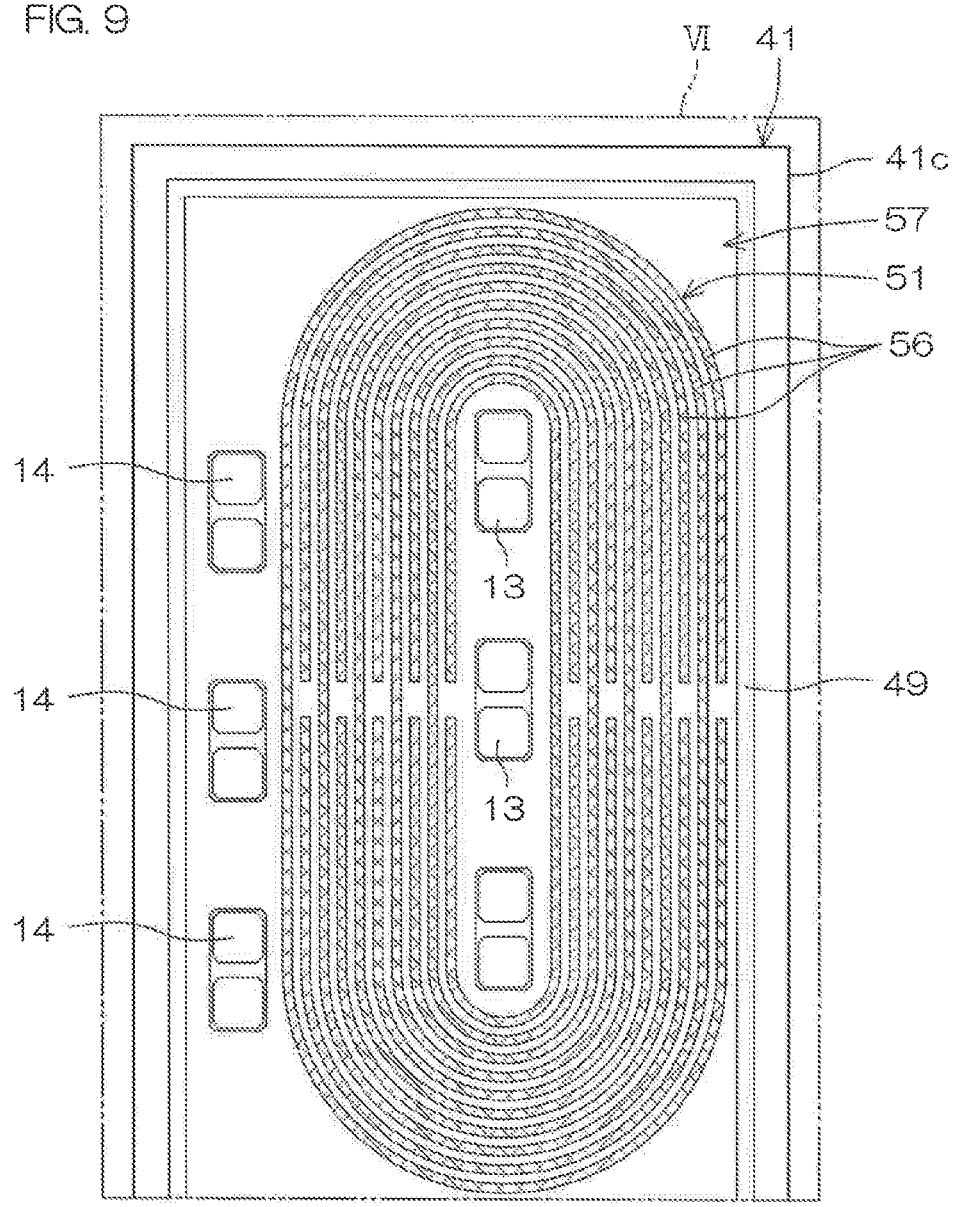
FIG. 9 is an enlarged view of a region corresponding to FIG. 4, showing a first modification of an uneven structure.

The uneven structure 51 may employ the form shown in FIG. 9. FIG. 9 is an enlarged view of a region corresponding to FIG. 4, showing a first modification of the uneven structure 51.

Referring to FIG. 9, the plurality of high-voltage pads 13 are surrounded by the plurality of recess portions 56. In this modification, the plurality of recess portions 56 are formed into ended shapes so as to respectively form open portions where no recess portions are present. Each open portion is defined by a region between both ends of each recess portion 56.

The plurality of recess portions 56 include an inner recess portion 56 positioned on the plurality of high-voltage pads 13 side and an outer recess portion 56 positioned on the opposite side of the plurality of high-voltage pads 13 with respect to the inner recess portion 56. The outer recess portion 56 extends to close the open portion of the inner recess portion 56 from the outside.

The plurality of recess portions 56 are formed at intervals along a facing direction of the high-voltage pads 13 and the low-voltage pads 14 and extend along a direction intersecting the facing direction in a region between the high-voltage pads 13 and the low-voltage pads 14.

The plurality of recess portions 56 are formed at intervals along a facing direction of the high-voltage pads 13 and the shield electrode layer 49 and extend along a direction intersecting the facing direction in a region between the high-voltage pads 13 and the shield electrode layer 49.

Even by this structure, the creeping distance between the high-voltage pad 13 and the low-voltage pad 14 and the creeping distance between the high-voltage pad 13 and the shield electrode layer 49 can be increased.

FIG. 9 shows an example in which all recess portions 56 are formed into ended shapes, however, all recess portions 56 do not necessarily have to be formed into ended shapes, and an arbitrary recess portion 56 may be formed into an ended shape. For example, only one recess portion 56 may be formed into an ended shape.

Figure 10:
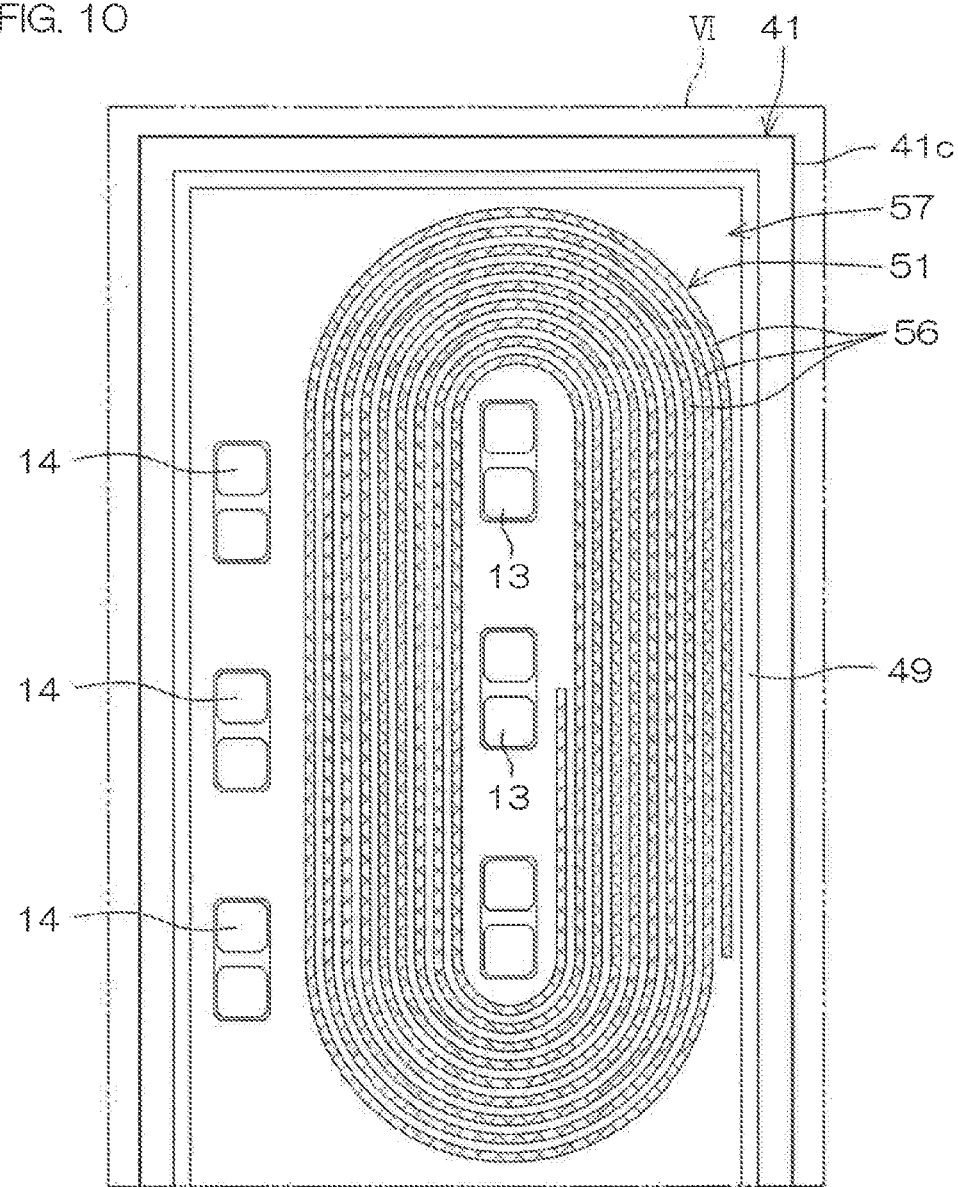
FIG. 10 is an enlarged view of a region corresponding to FIG. 4, showing a second modification of the uneven structure.

It is also possible to form the uneven structure 51 as shown in FIG. 10. FIG. 10 is an enlarged view of a region corresponding to FIG. 4, showing a second modification of the uneven structure 51.

Referring to FIG. 10, in this modification, a plurality of high-voltage pads 13 are surrounded by one recess portion 56 spirally extending in a plan view. The spiral recess portion 56 is formed by spirally integrally linking a plurality of recess portions 56 formed at intervals along a direction away from the high-voltage pads 13.

The spiral recess portion 56 is formed at intervals along a facing direction of the high-voltage pads 13 and the low-voltage pads 14, and extends along a direction intersecting the facing direction in the region between the high-voltage pads 13 and the low-voltage pads 14.

In a region between the high-voltage pads 13 and the shield electrode layer 49, the spiral recess portion 56 is formed at intervals along a facing direction of the high-voltage pads 13 and the shield electrode layer 49 and extends along a direction intersecting the facing direction.

Even by this structure, the creeping distance between the high-voltage pad 13 and the low-voltage pad 14, and the creeping distance between the high-voltage pad 13 and the shield electrode layer 49, can be increased.

Figure 11:
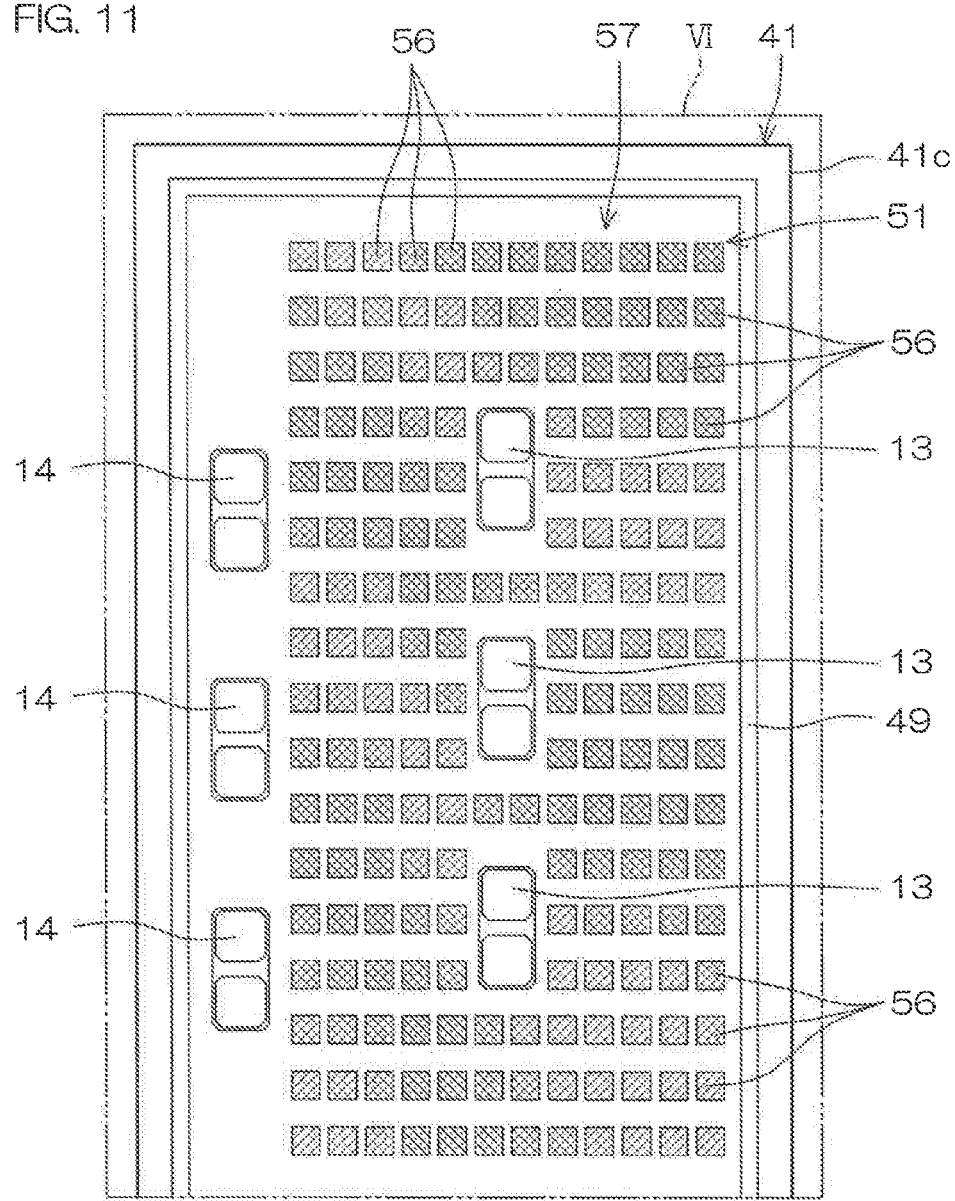
FIG. 11 is an enlarged view of the region corresponding to FIG. 4, showing a third modification of the uneven structure.

It is also possible to form the uneven structure 51 as shown in FIG. 11. FIG. 11 is an enlarged view of a region corresponding to FIG. 4, showing a third modification of the uneven structure 51.

Referring to FIG. 11, in this modification, in the surface insulating layer 50, a plurality of recess portions 56 are formed in a region between the high-voltage pads 13 and the low-voltage pads 14. In addition, in the surface insulating layer 50, a plurality of recess portions 56 are formed in a region between the high-voltage pads 13 and the shield electrode layer 49.

In the region between the high-voltage pad 13 and the low-voltage pads 14, the plurality of recess portions 56 are discretely formed at intervals along a facing direction of the high-voltage pads 13 and the low-voltage pads 14 and a direction intersecting the facing direction.

In this modification, the plurality of recess portions 56 are regularly arranged in a matrix in the region between the high-voltage pads 13 and the low-voltage pads 14. The plurality of recess portions 56 may be irregularly arranged in the region between the high-voltage pads 13 and the low-voltage pads 14.

In the region between the high-voltage pads 13 and the shield electrode layer 49, the plurality of recess portions 56 are discretely formed at intervals along a facing direction of the high-voltage pads 13 and the shield electrode layer 49 and a direction intersecting the facing direction.

In this modification, the plurality of recess portions 56 are regularly arranged in a matrix in the region between the high-voltage pads 13 and the shield electrode layer 49. The plurality of recess portions 56 may be irregularly arranged in the region between the high-voltage pads 13 and the low-voltage pads 14.

The plurality of recess portions 56 may be discretely formed in the entire surface of the surface insulating layer 50. The plurality of recess portions 56 may be formed into polygonal shapes such as triangular shapes, hexagonal shapes, and quadrangular shapes (including rectangular shapes), etc., in a plan view. The plurality of recess portions 56 may be formed into circular shapes in a plan view.

Even by this structure, the creeping distance between the high-voltage pad 13 and the low-voltage pad 14 and the creeping distance between the high-voltage pad 13 and the shield electrode layer 49 can be increased.

It is also possible to form the uneven structure 51 as shown in FIG. 12. FIG. 12 is an enlarged view of a region corresponding to FIG. 4, showing a fourth modification of the uneven structure 51.

Referring to FIG. 12, in this modification, the plurality of recess portions 56 are formed in the region between the high-voltage pads 13 and the low-voltage pads 14 and the region between the high-voltage pads 13 and the shield electrode layer 49 so as to sandwich the plurality of high-voltage pads 13.

In the region between the high-voltage pads 13 and the low-voltage pads 14, the plurality of recess portions 56 are formed at intervals in a facing direction of the high-voltage pads 13 and the low-voltage pads 14 and extend in the forms of belts along a direction intersecting (orthogonal to) the facing direction.

In the region between the high-voltage pads 13 and the shield electrode layer 49, the plurality of recess portions 56 are formed at intervals in a facing direction of the high-voltage pads 13 and the shield electrode layer 49, and extend in the forms of belts along a direction intersecting (orthogonal to) the facing direction.

Even by this structure, the creeping distance between the high-voltage pad 13 and the low-voltage pad 14 and the creeping distance between the high-voltage pad 13 and the shield electrode layer 49 can be increased.

The transformer chip 5 may have an uneven structure formed by combining arbitrary two or more of the plurality of uneven structures 51 shown in FIG. 6, FIG. 9, FIG. 10, FIG. 11, and FIG. 12. The transformer chip 5 may have an uneven structure 51 that includes a plurality of recess portions 56 surrounding the high-voltage pads 13, and a plurality of recess portions 56 discretely formed in the region between the high-voltage pads 13 and the low-voltage pads 14.

FIG. 13A to FIG. 13D are essential portion enlarged views of the transformer chip 5, to describe an example of a method of manufacturing the uneven structure 51.

Referring to FIG. 13A, first, the functional element main body 41 is prepared. The functional element main body 41 includes the substrate 42 and the insulating layer laminated structure 43 (refer to FIG. 7, etc., as well).

Next, a base electrode layer (not shown) that serves as a base of the high-voltage pads 13 and the low-voltage pads 14 is formed on the first principal surface 41a of the functional element main body 41. The base electrode layer may be formed by sputtering. The base electrode layer may include an aluminum-copper alloy.

Next, unnecessary portions of the base electrode layer are removed. The unnecessary portions of the base electrode layer may be removed by etching through a mask (not shown). Thereby, the base electrode layer is patterned into a predetermined shape to form the high-voltage pads 13 and the low-voltage pads 14.

Figure 13B:
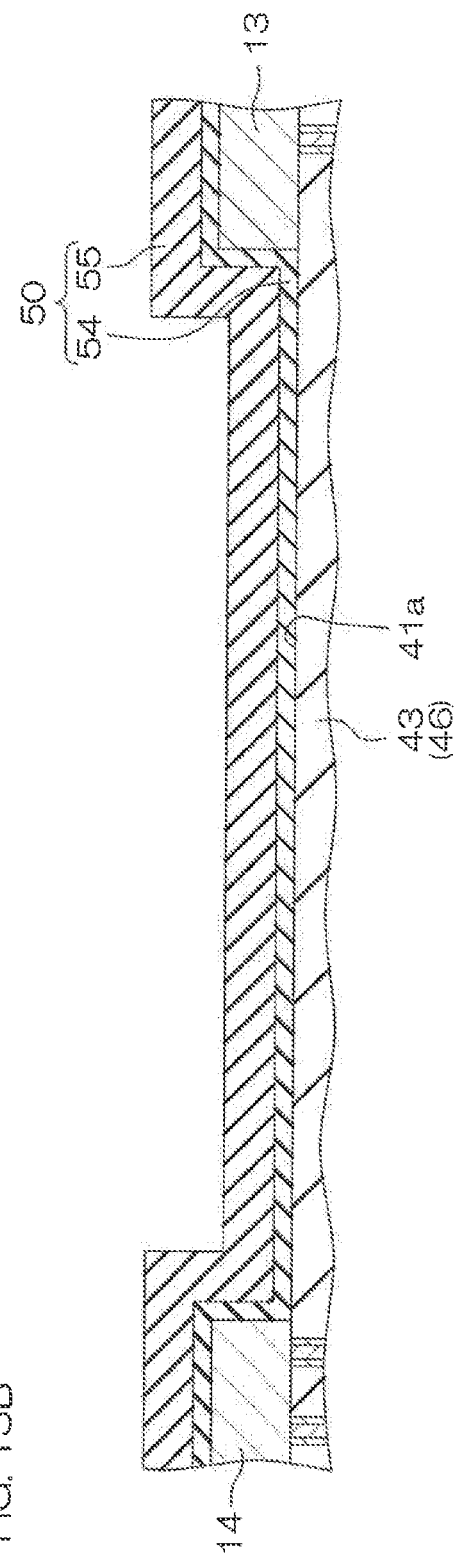
FIG. 13B is a view showing a process after the process of FIG. 13A.

Next, referring to FIG. 13B, the protective film 54 is formed on the first principal surface 41a of the functional element main body 41 so as to cover the high-voltage pads 13 and the low-voltage pads 14. The protective film 54 may be formed by CVD. The protective film 54 may include $SiO_2$.

Next, the passivation film 55 is formed on the protective film 54. The passivation film 55 may be formed by CVD. The passivation film 55 may include SiN. The surface insulating layer 50 is formed of a laminated structure including the protective film 54 and the passivation film 55.

Figure 13C:
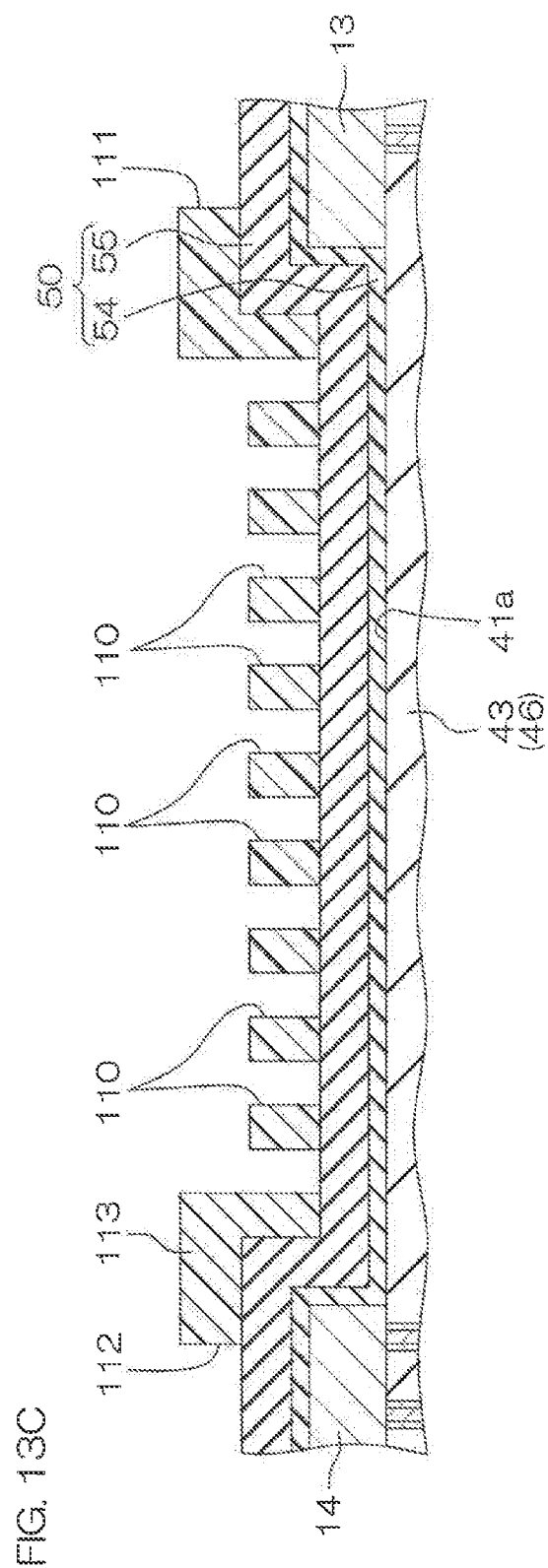
FIG. 13C is a view showing a process after the process of FIG. 13B.

Next, referring to FIG. 13C, a mask 113 with a predetermined pattern is formed on the surface insulating layer 50. The mask 113 has a plurality of openings 110, 111, and 112 to expose regions in which the plurality of recess portions 56 should be formed, regions in which the pad openings 52 should be formed, and regions in which the pad openings 53 should be formed.

Next, referring to FIG. 13D, unnecessary portions of the surface insulating layer 50 are removed. The unnecessary portions of the surface insulating layer 50 may be removed by etching (for example, dry etching) through the mask 113.

In this process, in addition to the surface insulating layer 50, a part of the insulating layer laminated structure 43 (the uppermost interlayer dielectric film 46) is also removed. Thereby, a plurality of recess portions 56 are formed in the surface insulating layer 50. In addition, the pad openings 52 to expose the high-voltage pads 13 and the pad openings 53 to expose the low-voltage pads 14 are accordingly formed. Thereafter, the mask 113 is removed.

Next, the sealing resin 7 is formed to cover the surface insulating layer 50 by infilling the plurality of recess portions 56. In the sealing resin 7, a portion in contact with the surface insulating layer 50 is formed as a resin layer 58. The transformer chip 5 is formed in this way.

Figure 14:
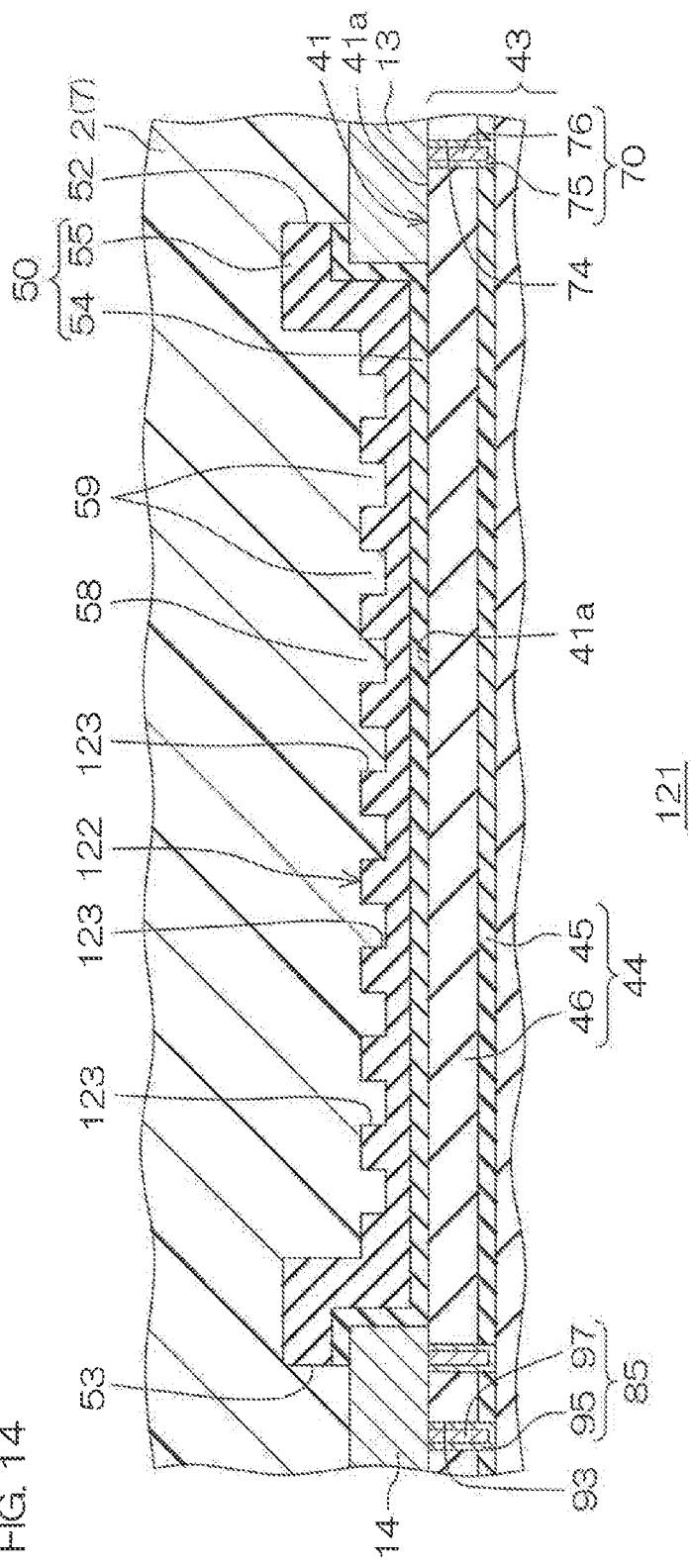
FIG. 14 is an essential portion enlarged view of a transformer chip according to a second preferred embodiment of the present invention, showing a region in which an uneven structure is formed.

FIG. 14 is an essential portion enlarged view of a transformer chip 121 according to a second preferred embodiment of the present invention, showing a region in which an uneven structure 122 is formed in the transformer chip 121. Hereinafter, the same reference sign is given to a constituent equivalent to each constituent described with respect to the transformer chip 5, and a description thereof is omitted.

The transformer chip 121 has substantially the same configuration as the transformer chip 5 except for including the uneven structure 122 in place of the uneven structure 51. The uneven structure 122 includes a plurality of recess portions 123 recessed from the surface of the surface insulating layer 50 toward the insulating layer laminated structure 43.

The plurality of recess portions 123 do not penetrate through the surface insulating layer 50. The plurality of recess portions 123 have side walls and bottom walls inside the surface insulating layer 50. In detail, the side walls and bottom walls of the plurality of recess portions 123 are positioned inside the passivation film 55.

At least one of the planar shapes of the plurality of recess portions 56 shown in FIG. 6, the planar shapes of the plurality of recess portions 56 shown in FIG. 9, the planar shapes of the plurality of recess portions 56 shown in FIG. 10, the planar shapes of the plurality of recess portions 56 shown in FIG. 11, and the planar shapes of the plurality of recess portions 56 shown in FIG. 12 may be adopted as planar shapes of the plurality of recess portions 123.

As described above, according to the transformer chip 121, the uneven structure 122 is formed inside the surface insulating layer 50. The uneven structure 122 includes the plurality of recess portions 123 formed inside the surface insulating layer 50. The plurality of recess portions 123 have side walls and bottom walls inside the surface insulating layer 50.

Thereby, the creeping distance between the high-voltage pad 13 and the shield electrode layer 49, and the creeping distance between the high-voltage pad 13 and the shield electrode layer 49, can be increased. Therefore, substantially the same effect as that described with respect to the transformer chip 5 can be obtained.

FIG. 15A to FIG. 15D are essential portion enlarged views of the transformer chip 121, to describe an example of a method of manufacturing the uneven structure 122.

Referring to FIG. 15A, first, through the same processes as in FIG. 13A and FIG. 13B described above, the surface insulating layer 50 is formed on the first principal surface 41a of the functional element main body 41.

Next, a mask 126 with a predetermined pattern is formed on the surface insulating layer 50. The mask 126 includes openings 124 and 125 to expose regions in which the pad openings 52 should be formed and regions in which the pad openings 53 should be formed.

Figure 15B:
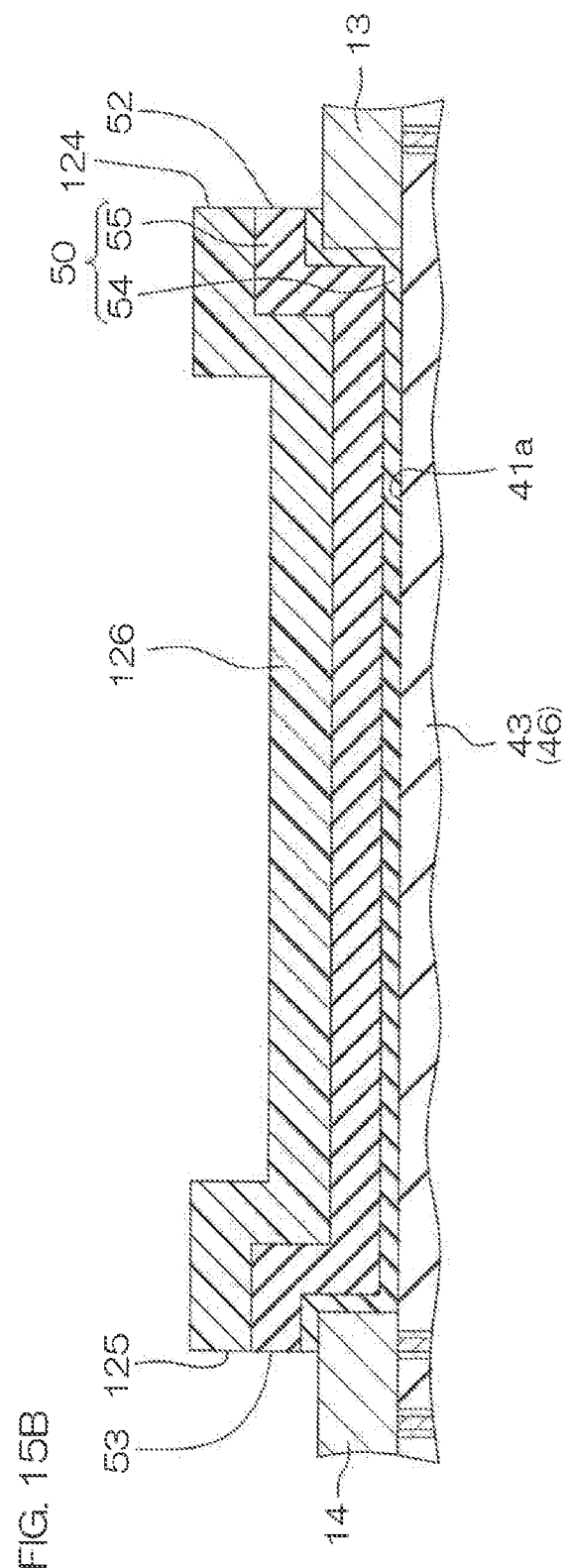
FIG. 15B is a view showing a process after the process of FIG. 15A.

Next, referring to FIG. 15B, unnecessary portions of the surface insulating layer 50 are removed. The unnecessary portions of the surface insulating layer 50 may be removed by etching (for example, dry etching) through the mask 126.

Thereby, the surface insulating layer 50 is patterned into a predetermined shape, and accordingly, the pad openings 52 to expose the high-voltage pads 13 and the pad openings 53 to expose the low-voltage pads 14 are formed. Thereafter, the mask 126 is removed.

Figure 15C:
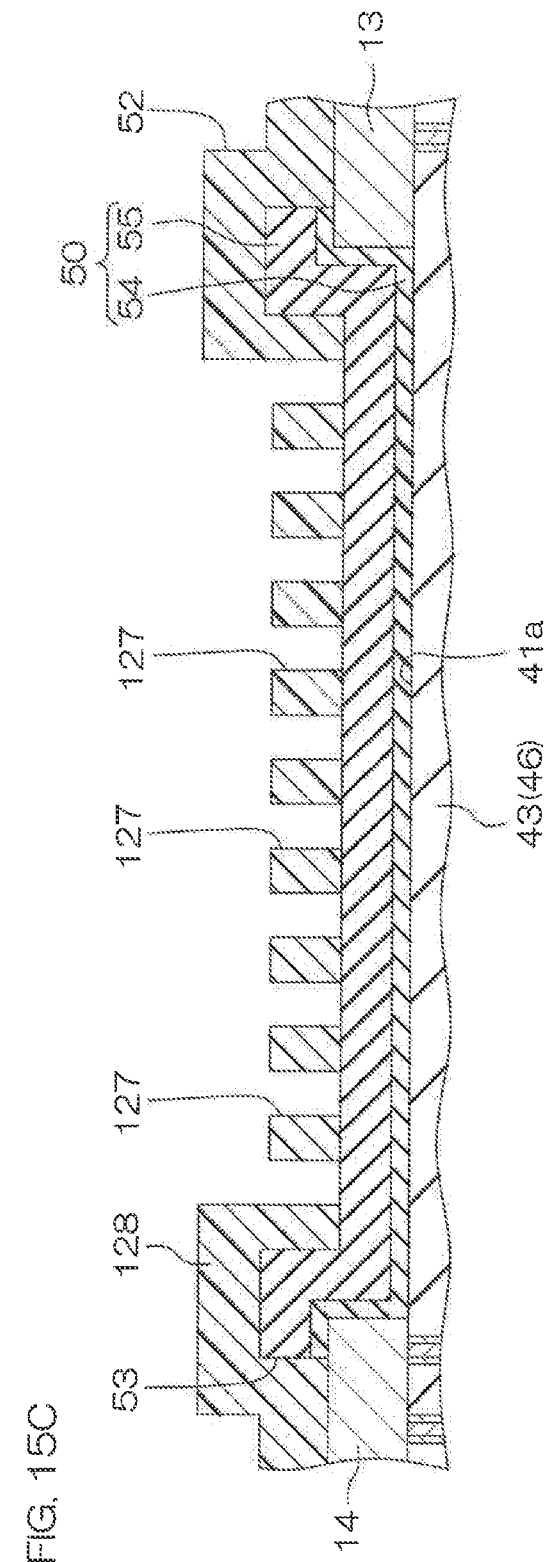
FIG. 15C is a view showing a process after the process of FIG. 15B.

Next, referring to FIG. 15C, a mask 128 with a predetermined pattern is formed on the surface insulating layer 50. The mask 128 has a plurality of openings 127 to expose regions in which the plurality of recess portions 123 should be formed.

Figure 15D:
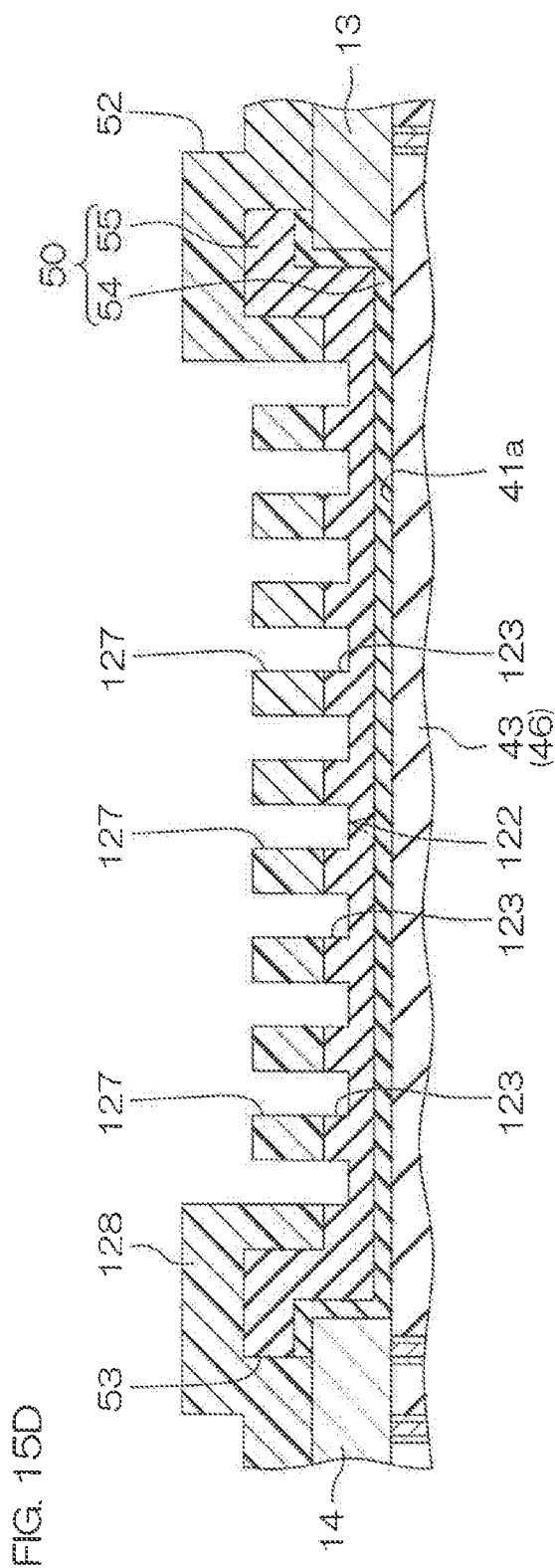
FIG. 15D is a view showing a process after the process of FIG. 15C.

Next, referring to FIG. 15D, unnecessary portions of the surface insulating layer 50 are removed. The unnecessary portions of the surface insulating layer 50 may be removed by etching (for example, dry etching) through the mask 128. In this process, only the surface layer portion of the surface insulating layer 50 is selectively removed. Accordingly, a plurality of recess portions 123 are formed in the surface insulating layer 50. Thereafter, the mask 128 is removed.

Next, the sealing resin 7 is formed to cover the surface insulating layer 50 by infilling the plurality of recess portions 123. In the sealing resin 7, a portion in contact with the surface insulating layer 50 is formed as a resin layer 58. The transformer chip 121 is formed in this way.

Figure 16:
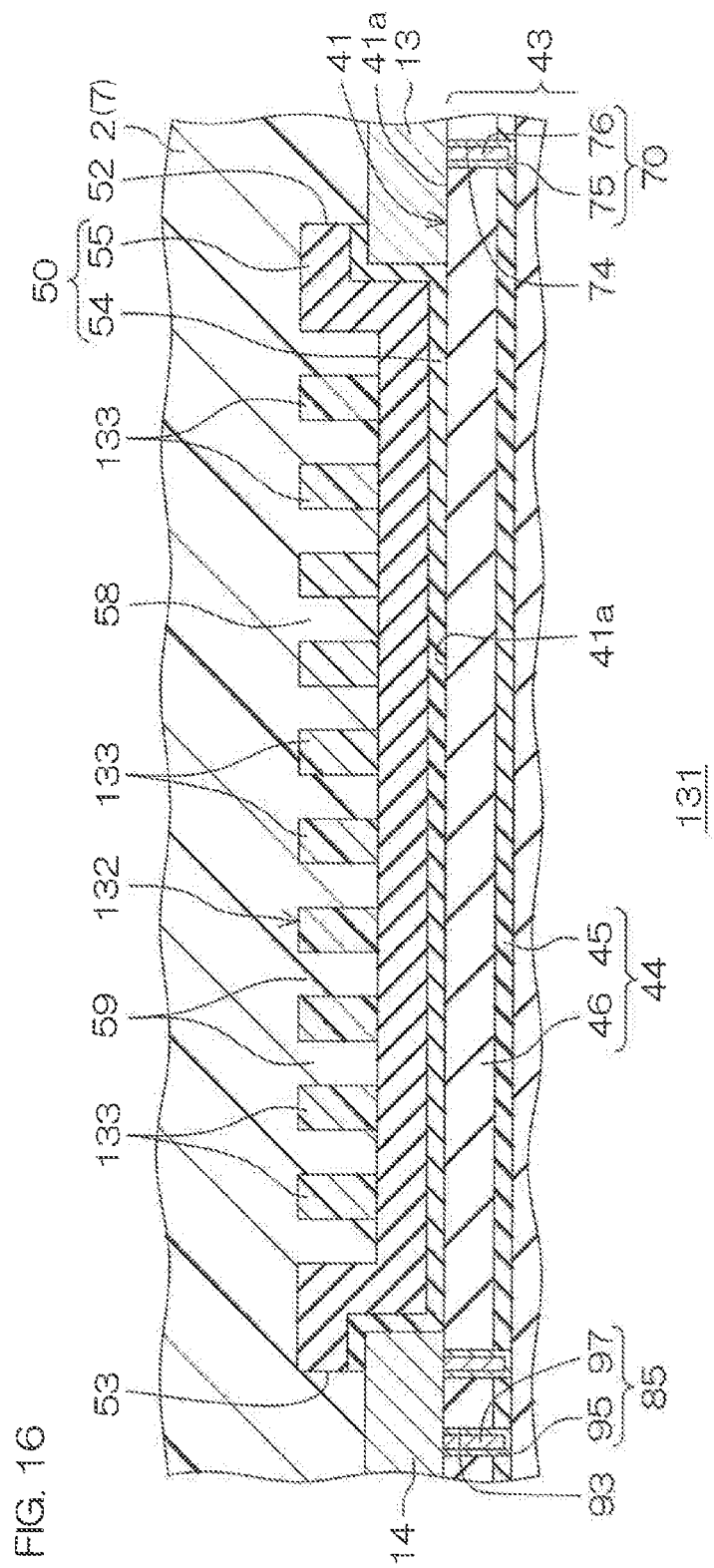
FIG. 16 is an essential portion enlarged view of a transformer chip according to a third preferred embodiment of the present invention, showing a region in which an uneven structure is formed.

FIG. 16 is an essential portion enlarged view of a transformer chip 131 according to a third preferred embodiment of the present invention, showing a region in which an uneven structure 132 is formed in the transformer chip 131. Hereinafter, the same reference sign is given to a constituent equivalent to each constituent described with respect to the transformer chip 5, and a description thereof is omitted.

The transformer chip 131 has substantially the same configuration as the transformer chip 5 except for including the uneven structure 132 in place of the uneven structure 51. The uneven structure 132 includes a plurality of protrusion portions 133.

The plurality of protrusion portions 133 are respectively formed on the surface insulating layer 50. The plurality of protrusion portions 133 define irregularities between the protrusion portions and the surface of the surface insulating layer 50.

The plurality of protrusion portions 133 are made of an insulating material. The plurality of protrusion portions 133 may include an organic-based insulating material or an inorganic-based insulating material. The plurality of protrusion portions 133 may include at least one kind of a polyimide resin, a polyamide resin, a phenol resin, $SiO_2$, SiN, or AlN.

The plurality of protrusion portions 133 preferably include an insulating material different from the insulating material forming the surface insulating layer 50. With this configuration, when the plurality of protrusion portions 133 are formed on the surface insulating layer 50, the surface insulating layer 50 can be used as an etching stopper layer.

At least one of the planar shapes of the plurality of recess portions 56 shown in FIG. 6, the planar shapes of the plurality of recess portions 56 shown in FIG. 9, the planar shapes of the plurality of recess portions 56 shown in FIG. 10, the planar shapes of the plurality of recess portions 56 shown in FIG. 11, and the planar shapes of the plurality of recess portions 56 shown in FIG. 12 may be adopted as planar shapes of the plurality of protrusion portions 133.

As described above, the transformer chip 131 has the uneven structure 132 including the plurality of protrusion portions 133. Even this structure can bring about the same effect as that described with respect to the transformer chip 5.

FIG. 17A to FIG. 17E are essential portion enlarged views of the transformer chip 131, to describe an example of a method of manufacturing the uneven structure 132 in the transformer chip 131 shown in FIG. 16.

Referring to FIG. 17A, first, through the same processes as the processes shown in FIG. 13A and FIG. 13B described above, the surface insulating layer 50 is formed on the first principal surface 41a of the functional element main body 41.

Next, a mask 136 with a predetermined pattern is formed on the surface insulating layer 50. The mask 136 includes openings 134 and 135 to expose regions in which the pad openings 52 should be formed and regions in which the pad openings 53 should be formed.

Next, referring to FIG. 17B, unnecessary portions of the surface insulating layer 50 are removed. The unnecessary portions of the surface insulating layer 50 may be removed by etching (for example, dry etching) through the mask 136.

Thereby, the surface insulating layer 50 is patterned into a predetermined shape, and accordingly, the pad openings 52 to expose the high-voltage pads 13 and the pad openings 53 to expose the low-voltage pads 14 are formed in the surface insulating layer 50. Thereafter, the mask 136 is removed.

Figure 17C:
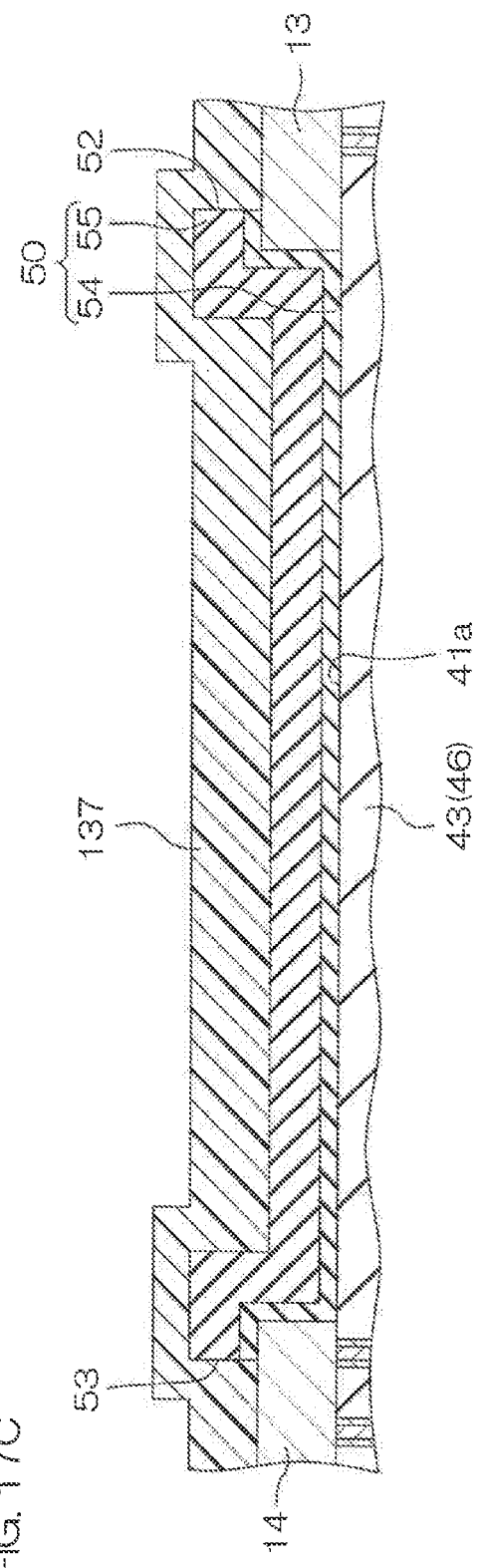
FIG. 17C is a view showing a process after the process of FIG. 17B.

Next, referring to FIG. 17C, a resin film 137 is formed on the surface insulating layer 50. The resin film 137 may be formed by applying a photosensitive resin (for example, polyimide resin) onto the surface of the surface insulating layer 50.

Next, referring to FIG. 17D, the resin film 137 is exposed through a photomask 139 having a plurality of openings 138. The plurality of openings 138 respectively expose portions where the protrusion portions 133 should be formed.

Next, referring to FIG. 17E, the resin film 137 is developed. Accordingly, the plurality of protrusion portions 133 are formed on the surface insulating layer 50.

Next, the sealing resin 7 is formed to cover the surface insulating layer 50 by infilling the plurality of recess portions 123. In the sealing resin 7, a portion in contact with the surface insulating layer 50 is formed as a resin layer 58. The transformer chip 131 is formed in this way.

In FIG. 17A to FIG. 17E, an example in which the plurality of protrusion portions 133 are made of an organic-based insulating material (polyimide resin) is described. However, in place of the organic-based insulating material, the plurality of protrusion portions 133 may be made of an inorganic-based insulating material.

In this case, first, in the process of FIG. 17C, a base insulating film (not shown) made of an inorganic-based insulating material is formed on the surface insulating layer 50. The base insulating film may include $SiO_2$. The base insulating film may be formed by CVD.

Next, in the process of FIG. 17D, a mask (not shown) with a predetermined pattern is formed on the base insulating film. The mask (not shown) covers regions in which the plurality of protrusion portions 133 should be formed, and exposes other regions.

Next, in the process of FIG. 17E, unnecessary portions of the base insulating film are removed. The unnecessary portions of the base insulating film may be removed by etching (for example, dry etching) through the mask (not shown). Thereby, the plurality of protrusion portions 133 are formed on the surface insulating layer 50. The transformer chip 131 is formed in this way.

Preferred embodiments of the present invention are described above, and the present invention can also be carried out by other preferred embodiments.

In the first preferred embodiment described above, the structure shown in FIG. 18 may be adopted. FIG. 18 is an enlarged view of a region corresponding to FIG. 4, showing a modification of the uneven structure 51.

Hereinafter, the same reference sign is given to a constituent equivalent to each constituent described with respect to the transformer chip 5, and a description thereof is omitted.

Referring to FIG. 18, only in the region between the high-voltage pads 13 and the shield electrode layer 49, a plurality of recess portions 56 (uneven structure 51) are formed.

In the region between the high-voltage pads 13 and the shield electrode layer 49, the plurality of recess portions 56 extend in the forms of belts along a direction intersecting (orthogonal to) the facing direction of the high-voltage pads 13 and the shield electrode layer 49. Also, in the region between the high-voltage pads 13 and the shield electrode layer 49, the plurality of recess portions 56 are formed at intervals in the facing direction of the high-voltage pads 13 and the shield electrode layer 49.

With this structure, although the creeping distance between the high-voltage pad 13 and the low-voltage pad 14 cannot be increased, the creeping distance between the high-voltage pad 13 and the shield electrode layer 49 can be increased. Therefore, this structure may be adopted under a situation where creeping discharge occurring in the region between the high-voltage pad 13 and the low-voltage pad 14 becomes a problem.

Of course, the structure shown in FIG. 18 may also be combined with the transformer chip 121 and the transformer chip 131.

Figure 19:
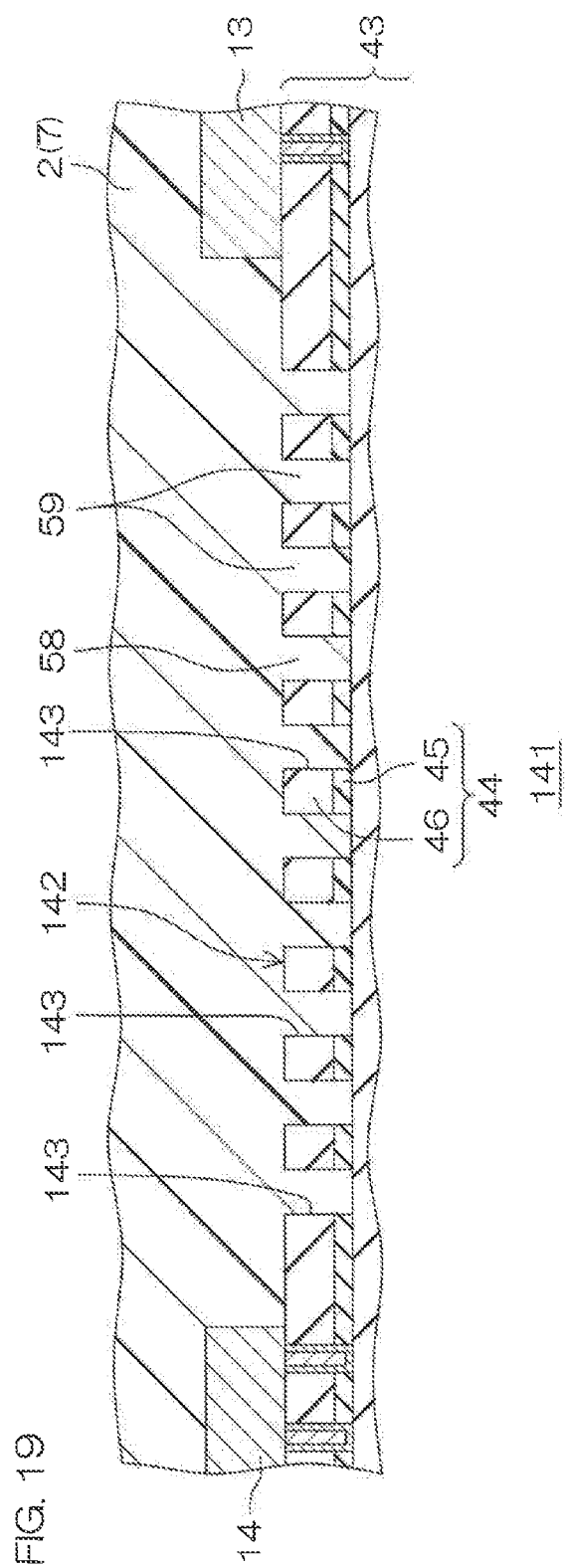
FIG. 19 is an essential portion enlarged view of a transformer chip according to a modification, showing a region in which an uneven structure is formed.

In the first preferred embodiment described above, the structure shown in FIG. 19 may be adopted. FIG. 19 is an essential portion enlarged view of a transformer chip 141 according to a modification, showing a region in which an uneven structure 142 is formed in the transformer chip 141.

Hereinafter, the same reference sign is given to a constituent equivalent to each constituent described with respect to the transformer chip 5, and a description thereof is omitted.

The transformer chip 141 does not have the surface insulating layer 50. The transformer chip 141 includes an uneven structure 142 formed in the region between the high-voltage pads 13 and the low-voltage pads 14 in the insulating layer laminated structure 43.

The uneven structure 142 includes a plurality of recess portions 143 recessed in a thickness direction from the surface of the insulating layer laminated structure 43. The plurality of recess portions 143 are formed to penetrate through the uppermost insulating layer 44 (the etching stopper film 45 and the interlayer dielectric film 46 as an upper layer on the etching stopper film).

The plurality of recess portions 143 may be formed at the same time as the process of forming the wiring grooves 74 of the via holes 70. The plurality of recess portions 143 may be formed to penetrate through only the interlayer dielectric film 46 in the uppermost insulating layer 44.

The plurality of recess portions 143 can be formed by applying a part of the process of forming the plurality of recess portions 56 described above (refer to FIG. 13C and FIG. 13D) as a process of forming the plurality of recess portions 143 in the insulating layer laminated structure 43.

The plurality of recess portions 143 can also be formed by applying a part of the process of forming the plurality of recess portions 123 (refer to FIG. 15C and FIG. 15D) as a process of forming the plurality of recess portions 143 in the insulating layer laminated structure 43. The resin layer 58 infills the uneven structure 142.

At least one of the planar shapes of the plurality of recess portions 56 shown in FIG. 6, the planar shapes of the plurality of recess portions 56 shown in FIG. 9, the planar shapes of the plurality of recess portions 56 shown in FIG. 10, the planar shapes of the plurality of recess portions 56 shown in FIG. 11, and the planar shapes of the plurality of recess portions 56 shown in FIG. 12 may be adopted as planar shapes of the plurality of recess portions 143.

Even this structure can also bring about the same effect as that described with respect to the transformer chip 5. However, from the viewpoint of protection of the transformer 27 (functional element) and the functional element main body 41, the structure in which the functional element main body 41 is covered by the surface insulating layer 50 is more preferable.

Of course, the structure in which the uneven structure 142 is formed can be combined with the transformer chip 5, the transformer chip 121, and the transformer chip 131.

Figure 20:
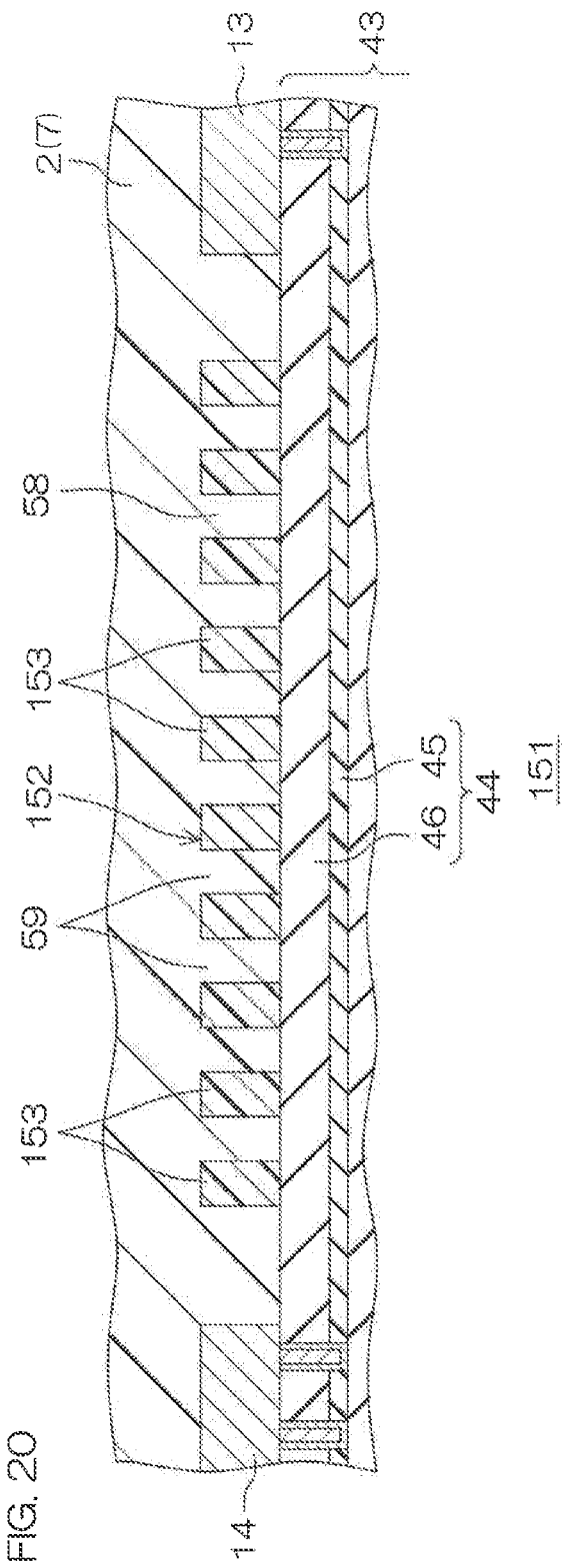
FIG. 20 is an essential portion enlarged view of a transformer chip according to another modification, showing a region in which an uneven structure is formed.

In the first preferred embodiment described above, the structure shown in FIG. 20 may be adopted. FIG. 20 is an essential portion enlarged view of a transformer chip 151 according to another modification, showing a region in which an uneven structure 152 is formed in a transformer chip 151.

Hereinafter, the same reference sign is given to a constituent equivalent to each constituent described with respect to the transformer chip 5, and a description thereof is omitted.

The transformer chip 151 does not have the surface insulating layer 50. The transformer chip 151 includes an uneven structure 152 formed in a region between the high-voltage pads 13 and the low-voltage pads 14 in the insulating layer laminated structure 43.

The uneven structure 152 includes a plurality of protrusion portions 153 formed on the insulating layer laminated structure 43 (the uppermost interlayer dielectric film 46). The plurality of protrusion portions 153 define irregularities between the protrusion portions and the surface of the insulating layer laminated structure 43 (the uppermost interlayer dielectric film 46).

The plurality of protrusion portions 153 are made of an insulating material. The plurality of protrusion portions 153 may include an organic-based insulating material or an inorganic-based insulating material. The plurality of protrusion portions 153 may include at least one kind of a polyimide resin, a polyamide resin, a phenol resin, $SiO_2$, SiN, or AlN.

The plurality of protrusion portions 153 preferably include an insulating material different from the insulating material forming the insulating layer laminated structure 43 (the uppermost interlayer dielectric film 46). With this configuration, when the plurality of protrusion portions 153 are formed on the insulating layer laminated structure 43 (the uppermost interlayer dielectric film 46), the insulating layer laminated structure 43 (the uppermost interlayer dielectric film 46) can be used as an etching stopper layer.

The plurality of protrusion portions 153 can be formed by applying a part of the process of forming the plurality of protrusion portions 133 described above (refer to FIG. 17C to FIG. 17E) as a process of forming the uneven structure 152 on the insulating layer laminated structure 43. The resin layer 58 infills the uneven structure 152.

At least one of the planar shapes of the plurality of recess portions 56 shown in FIG. 6, the planar shapes of the plurality of recess portions 56 shown in FIG. 9, the planar shapes of the plurality of recess portions 56 shown in FIG. 10, the planar shapes of the plurality of recess portions 56 shown in FIG. 11, and the planar shapes of the plurality of recess portions 56 shown in FIG. 12 may be adopted as planar shapes of the plurality of protrusion portions 153.

Even this structure can bring about the same effect as that described in the first preferred embodiment above. However, from the viewpoint of protection of the transformer 27 (functional element) and the functional element main body 41, the structure in which the functional element main body 41 is covered by the surface insulating layer 50 is more preferable.

Of course, the structure in which the uneven structure 152 is formed can be combined with the transformer chip 5, the transformer chip 121, and the transformer chip 131.

In the first preferred embodiment described above, in place of, or in addition to the uneven structure 51 surrounding the high-voltage pads 13, an uneven structure 51 surrounding the low-voltage pads 14 may be formed. The structure in which the uneven structure 51 surrounding the low-voltage pads 14 is formed is also applicable to the second preferred embodiment and the third preferred embodiment described above.

In each of the preferred embodiments described above, an example in which the substrate 42 is formed of a semiconductor substrate such as a silicon substrate and an SiC substrate is described. However, an insulating substrate made of an arbitrary insulating material may be adopted as the substrate 42. The insulating substrate is a glass substrate, a ceramic substrate, etc., by way of example.

A transformer chip having an uneven structure formed by combining at least two among the uneven structure 51 related to the transformer chip 5, 122 related to the transformer chip 121, and the uneven structure 132 related to the transformer chip 131, may be adopted.

For example, a transformer chip having an uneven structure formed by combining all of the uneven structures 51, 122, and 132 may be adopted. Also, a transformer chip having an uneven structure formed by combining the uneven structures 51 and 132 may be adopted.

Figure 21:
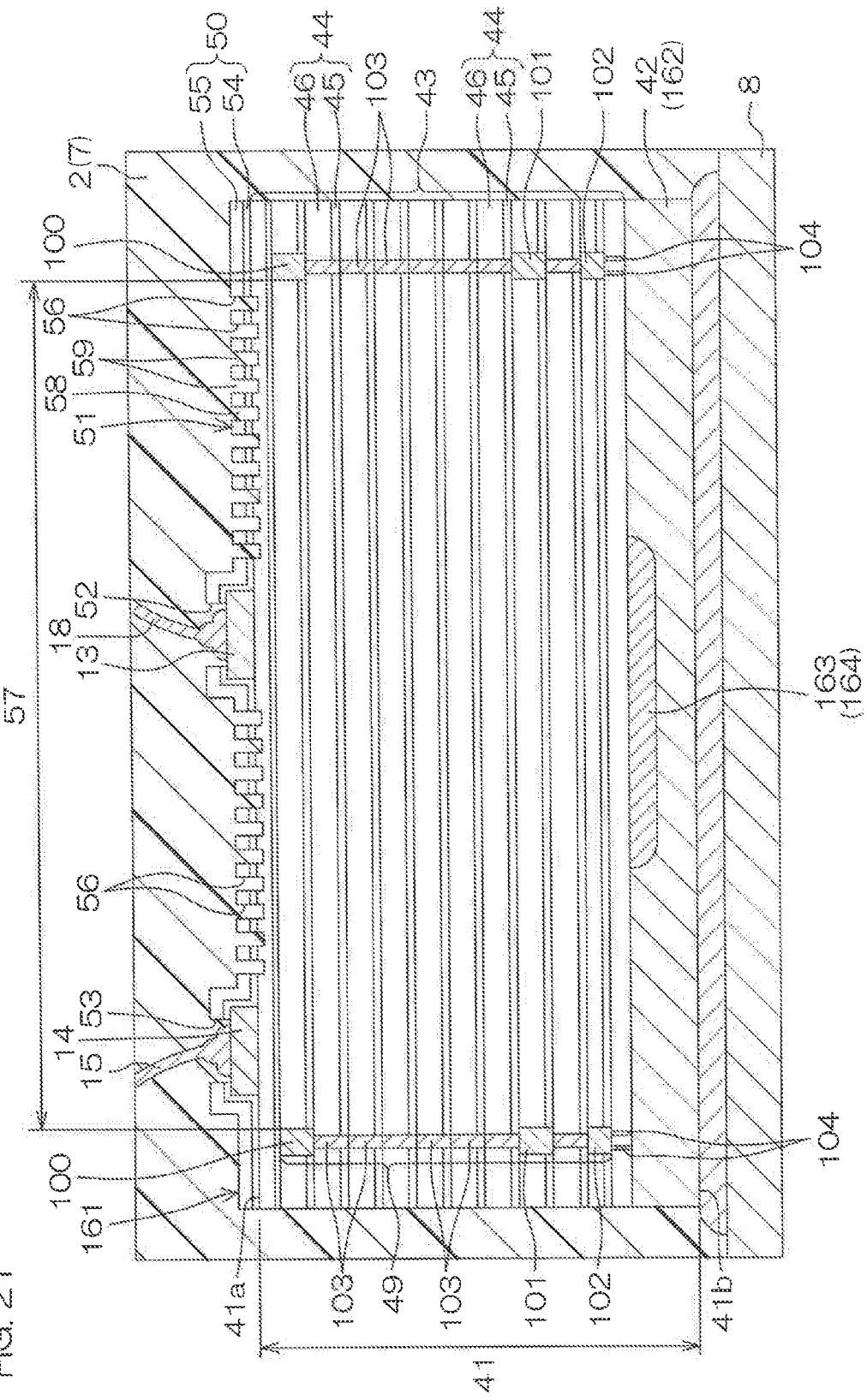
FIG. 21 is a schematic sectional view showing a form example in a case where an uneven structure of a transformer chip is applied to a semiconductor device.

The electronic component according to the present invention is applicable not only to a transformer chip but also to a semiconductor device 161 as shown in FIG. 21. FIG. 21 is a schematic sectional view showing a form example when the uneven structure 51 of the transformer chip 5 is applied to a semiconductor device 161.

Hereinafter, the same reference sign is given to a constituent equivalent to each constituent described with respect to the transformer chip 5, and a description thereof is omitted.

Referring to FIG. 21, the semiconductor device 161 includes a semiconductor layer 162 doped with an n-type impurity and/or a p-type impurity. The semiconductor layer 162 may have a structure including only a p-type or n-type substrate 42. The semiconductor layer 162 may have a laminated structure including a p-type or n-type substrate 42, and a p-type or n-type epitaxial layer laminated on the substrate 42.

In the surface layer portion of the semiconductor layer 162, a semiconductor element 164 having an impurity region 163 including an n-type impurity and/or a p-type impurity is formed. The semiconductor element 164 may include a diode, a bipolar transistor, a field effect transistor, a capacitor, and a resistor, etc. The capacitor and the resistor, etc., may be formed by utilizing the impurity region 163.

When the semiconductor element 164 includes a diode, an n-type impurity region 163 forming a p-n junction between the impurity region and the p-type semiconductor layer 162 is formed in the surface layer portion of the p-type semiconductor layer 162.

When the semiconductor element 164 includes a bipolar transistor, a pnp structure is formed in the surface layer portion of the n-type semiconductor layer 162. The pnp structure includes a p-type impurity region 163, an n-type impurity region 163, and a p-type impurity region 163 electrically connected to each other.

When the semiconductor element 164 includes a field effect transistor, in the surface layer portion of the semiconductor layer 162, a p-type impurity region 163 that serves as a body region, an n-type impurity region 163 that serves as a source region, and an n-type impurity region 163 that serves as a drain region, are formed. Then, on the semiconductor layer 162, a gate electrode that faces a channel region between the source region and the drain region across the gate insulating film is formed.

In FIG. 21, the semiconductor element 164 is electrically connected to the high-voltage pad 13 and the low-voltage pad 14 via internal wiring and via holes formed inside the insulating layer laminated structure 43 although this is not shown in the drawings. Therefore, the semiconductor element 164 is controlled based on a voltage applied between the high-voltage pad 13 and the low-voltage pad 14.

The semiconductor device 161 includes, as with the transformer chip 5, the uneven structure 51. Therefore, even by the semiconductor device 161, the same effect as that described in the transformer chip 5 can also be obtained.

The present application corresponds to Japanese Patent Application No. 2016-218181 filed on Nov. 8, 2016, at the Japan Patent Office, and the entire disclosure of the application is incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. An electronic component comprising:
a first insulating layer;
a functional element formed inside the insulating layer;
a high-voltage electrode formed on the first insulating layer;
a low-voltage electrode formed on the first insulating layer so as to be spaced from the high-voltage electrode;
an uneven structure formed in a region between the high-voltage electrode and the low-voltage electrode along a surface of the first insulating layer, and having a pattern independent of a pattern of the functional element;
wherein no electrodes are formed on the uneven structure.

2. The electronic component according to claim 1, further comprising:
a second insulating layer formed on the first insulating layer so as to expose the high-voltage electrode and the low-voltage electrode, wherein
the uneven structure includes a plurality of recess portions recessed from a surface of the second insulating layer toward the first insulating layer.

3. The electronic component according to claim 2, wherein the plurality of recess portions penetrate through the second insulating layer so as to expose the first insulating layer.

4. The electronic component according to claim 2, wherein the plurality of recess portions are formed at intervals along a facing direction where the high-voltage electrode and the low-voltage electrode face each other.

5. The electronic component according to claim 2, wherein the plurality of recess portions extend along a direction intersecting a facing direction where the high-voltage electrode and the low-voltage electrode face each other.

6. The electronic component according to claim 2, wherein the plurality of recess portions surround the high-voltage electrode.

7. The electronic component according to claim 2, wherein the plurality of recess portions are discretely formed in a region between the high-voltage electrode and the low-voltage electrode.

8. The electronic component according to claim 1, further comprising:
a second insulating layer formed on the first insulating layer so as to expose the high-voltage electrode and the low-voltage electrode, wherein
the uneven structure includes a plurality of protrusion portions that are formed on the second insulating layer, and define irregularities with the second insulating layer.

9. The electronic component according to claim 8, wherein the plurality of protrusion portions are formed at intervals along a facing direction where the high-voltage electrode and the low-voltage electrode face each other.

10. The electronic component according to claim 8, wherein the plurality of protrusion portions extend along a direction intersecting a facing direction where the high-voltage electrode and the low-voltage electrode face each other.

11. The electronic component according to claim 8, wherein the plurality of protrusion portions surround the high-voltage electrode.

12. The electronic component according to claim 8, wherein the plurality of protrusion portions are discretely formed in a region between the high-voltage electrode and the low-voltage electrode.

13. The electronic component according to claim 8, wherein the plurality of protrusion portions include an insulating material different from an insulating material that forms the second insulating layer.

14. The electronic component according to claim 1, wherein the uneven structure includes a plurality of recess portions recessed in a thickness direction of the first insulating layer from the surface of the first insulating layer.

15. The electronic component according to claim 1, wherein the uneven structure includes a plurality of protrusion portions formed on the first insulating layer.

16. The electronic component according to claim 1, further comprising a resin layer that infills the uneven structure.

17. The electronic component according to claim 16, wherein the resin layer has an uneven anchor structure that engages with the uneven structure.

18. The electronic component according to claim 1, further comprising:
an embedded low-voltage electrode embedded in a region around the high-voltage electrode in the first insulating layer, wherein
the uneven structure is formed in a region between the high-voltage electrode and the embedded low-voltage electrode along the surface of the first insulating layer.

19. The electronic component according to claim 18, wherein the embedded low-voltage electrode surrounds the high-voltage electrode in a plan view.

20. The electronic component according to claim 18, wherein the embedded low-voltage electrode surrounds the low-voltage electrode in a plan view.

21. An electronic component comprising:
an insulating layer;
a functional element formed inside the insulating layer;
a high-voltage electrode formed on the insulating layer;
an embedded low-voltage electrode embedded in a region around the high-voltage electrode in the insulating layer;
an uneven structure formed in a region between the high-voltage electrode and the embedded low-voltage electrode along the surface of the insulating layer, and having a pattern independent of a pattern of the functional element; and
wherein no electrodes are formed on the uneven structure.

22. The electronic component according to claim 21, further comprising a resin layer that infills the uneven structure.

23. The electronic component according to claim 22, wherein the resin layer has an uneven anchor structure that engages with the uneven structure.

24. The electronic component according to claim 21, wherein the embedded low-voltage electrode surrounds the high-voltage electrode in a plan view.

25. An electronic component comprising:
a functional element main body that includes a functional element and has a first principal surface and a second principal surface;
a high-voltage electrode formed on the first principal surface of the functional element main body;
a low-voltage electrode formed on the first principal surface of the functional element main body so as to be spaced from the high-voltage electrode;
an uneven structure formed in a region between the high-voltage electrode and the low-voltage electrode along the first principal surface of the functional element main body, and having a pattern independent of a pattern of the functional element; and
wherein no electrodes are formed on the uneven structure.

26. The electronic component according to claim 25, wherein
the functional element main body includes:
a substrate that forms the second principal surface of the functional element main body, and
an insulating layer that is laminated on the substrate, and forms the first principal surface of the functional element main body, and
the functional element includes a coil formed inside the insulating layer.

27. The electronic component according to claim 25, wherein
the functional element main body includes:
a semiconductor layer that forms the second principal surface of the functional element main body, and
an insulating layer that is laminated on the semiconductor layer, and forms the first principal surface of the functional element main body, and
the functional element includes a semiconductor element formed in the semiconductor layer.

* * * * *